(12) United States Patent
Vinciarelli

(10) Patent No.: US 9,112,422 B1
(45) Date of Patent: Aug. 18, 2015

(54) FAULT TOLERANT POWER CONVERTER

(75) Inventor: Patrizio Vinciarelli, Boston, MA (US)

(73) Assignee: VLT, Inc., Sunnyvale, CA (US)

( * ) Notice: Subject to any disclaimer, the term of this patent is extended or adjusted under 35 U.S.C. 154(b) by 769 days.

(21) Appl. No.: 13/044,063

(22) Filed: Mar. 9, 2011

Related U.S. Application Data

(60) Provisional application No. 61/312,110, filed on Mar. 9, 2010.

(51) Int. Cl.
*H02M 3/335* (2006.01)

(52) U.S. Cl.
CPC .................... *H02M 3/33576* (2013.01)

(58) Field of Classification Search
CPC .................. H02M 3/33592; H02M 3/33576; H02M 3/33584
USPC .......... 363/17, 21.06, 21.14, 24, 50; 327/108, 327/396, 423, 419, 424, 430–437
See application file for complete search history.

(56) References Cited

U.S. PATENT DOCUMENTS

| | | | |
|---|---|---|---|
| 6,031,743 A | 2/2000 | Carpenter et al. | |
| 6,035,261 A | 3/2000 | Carpenter et al. | |
| 6,275,958 B1 | 8/2001 | Carpenter et al. | |
| 6,466,458 B2 | 10/2002 | Zhang et al. | |
| 6,788,033 B2 | 9/2004 | Vinciarelli | |
| 6,911,848 B2 | 6/2005 | Vinciarelli | |
| 6,930,893 B2 | 8/2005 | Vinciarelli | |
| 6,934,166 B2 | 8/2005 | Vinciarelli | |
| 6,969,909 B2 | 11/2005 | Briere | |
| 6,975,098 B2 | 12/2005 | Vinciarelli | |
| 6,984,965 B2 | 1/2006 | Vinciarelli | |
| 6,985,341 B2 | 1/2006 | Vinciarelli et al. | |
| 7,145,786 B2 | 12/2006 | Vinciarelli | |
| RE40,072 E | 2/2008 | Prager et al. | |
| 7,561,446 B1 | 7/2009 | Vinciarelli | |
| 7,768,807 B2 * | 8/2010 | Chen et al. | 363/127 |

OTHER PUBLICATIONS

AN2738 (Application Note AN2738, "L6390 half-bridge gate driver," STMicroelectronics, Aug. 2009).*
ISL6210 (Datasheet ISL6210, "Dual Synchronous Rectified MOSFET Drivers," Intersil Americas Inc., Dec. 2008).*

* cited by examiner

*Primary Examiner* — Adolf Berhane
*Assistant Examiner* — Jye-June Lee
(74) *Attorney, Agent, or Firm* — Fish & Richardson P.C.

(57) ABSTRACT

Low-voltage outputs are provided by full-bridge rectification using controlled switches with fault detection monitoring of circuit conditions and disabling switches upon detection of a fault to decouple the converter from the system. Common-source dual MOSFET devices include elements arranged in alternating patterns on the die. Common-source dual synchronous rectifiers include control circuitry powered from the voltage across the complementary switch. A DC-to-DC transformer converts power using a fixed voltage transformation ratio. A clamp phase may be used to reduce power losses, control the output resistance, effectively regulate the voltage transformation ratio, provide narrow band output regulation, and control the rate of change of output voltage. A new point of load converter includes input driver circuitry removed from and output circuitry located at the point of load, with a transformer located near the output circuit and an AC bus between the driver circuit and the primary winding of the transformer.

49 Claims, 13 Drawing Sheets

FAULT TOLERANT POWER CONVERTER

CROSS REFERENCE TO RELATED APPLICATIONS

This application claims priority to U.S. provisional application 61/312,110, filed on Mar. 9, 2010, which is incorporated by reference in its entirety.

FIELD OF THE INVENTION

This invention relates to the field of switching power supplies and more particularly to power converters that are operated in fault-tolerant power-sharing arrays.

BACKGROUND

Contemporary electronic systems, e.g. computer servers, require fault tolerant power supplies, meaning that the power supply and the overall system must remain operational in the event of one or more power converter failures. In fault tolerant power systems, frequently a plurality of power converters are connected in power-sharing fault-tolerant arrays to supply power to the system bus. Each individual converter, or in some cases a subset of converters, are connected to a system power bus. Fault tolerant circuitry traditionally presents at least one additional switch in the output current path to isolate the converter from the system bus in the event of a fault.

FIG. 1 shows a block diagram of a prior-art fault-tolerant power system 10. The system as shown is a power sharing array including two power converters 12, 17 having paralleled inputs connected to an input source through respective disconnect switches 15, 19 and paralleled outputs connected to a system power bus 13 through respective disconnect switches 16, 20. Fault detection control circuits 14, 18 monitor operation of their respective converters 12, 17 and upon detecting a fault open their respective disconnect switches 15, 16 and 19, 20. Although only two converters are shown, any number of power converters, e.g. 12, 17 may be connected in parallel to supply power to the system bus 13. By appropriately scaling the size and number of converters (i.e. the total power throughput and granularity of the array), the array may be configured to continue to operate with a failure of one or more of the converters, allowing the system to continue to operate.

The disconnect switches 15, 16, 19, 20 are preferably electronically controlled switches such as MOSFETs with low ON resistance to minimize power loss in the switch. The fault detection control circuits 14, 18 typically monitor converter operating conditions to detect various faults, such as input or output shorts. When a fault is detected, the respective fault detection control circuit 14, 18 turns the respective switch OFF disconnecting the failed converter from the system bus and preventing the fault from bringing down the entire system.

Many contemporary electronic systems require high current, e.g. 100 A or more, at low voltages, e.g. 3V, 1V, or less. A Factorized Power Architecture well suited for supplying power to low voltage high current loads is described in Vinciarelli, Factorized Power with Point of Load Sine Amplitude Converters, U.S. Pat. No. 6,975,098 issued Dec. 13, 2005 (the "Micro FPA Patent") and U.S. Pat. No. 6,984,965 issued Jan. 10, 2006 (the "FPA Patent") (both assigned to VLT, Inc. of Sunnyvale, Calif., and the entire disclosure of each is incorporated herein by reference). Power converters which function as DC-to-DC transformers called Voltage Transformation Modules ("VTM") and Sine Amplitude Converters ("SAC") which have a transfer function approximating $Vo=K_{VTM}*Vin-Io*R_{VTM}$ are described in Vinciarelli, Factorized Power with Point of Load Sine Amplitude Converters, U.S. Pat. No. 6,930,893, Issued Aug. 16, 2005 (the "SAC Patent") and in Vinciarelli, Point of Load Sine Amplitude Converters and Methods, U.S. Pat. No. 7,145,786, Issued Dec. 5, 2006 (the "POL SAC Patent") (both assigned to VLT, Inc. of Sunnyvale, Calif., the entire disclosure of each is incorporated herein by reference).

A method of modulating the output resistance of power converters is described in Vinciarelli, Output Resistance Modulation in Power Converters, U.S. Pat. No. 6,934,166, Issued Aug. 23, 2005 (the "Modulation Patent") assigned to VLT, Inc. of Sunnyvale, Calif., the entire disclosure of which is incorporated herein by reference.

Various reasons for and methods of clamping inductors and transformers in power converters are known. A double-clamped buck-boost converter which, in addition to an active clamp, shunts the primary winding to retain energy in the transformer and control techniques for operating the converter are described in Vinciarelli, Double-Clamped ZVS Buck-Boost Power Converter, U.S. Pat. No. 7,561,446, Issued Jul. 14, 2009 (the "Double-Clamp Patent"). A buck-boost converter incorporating switches to retain energy in an inductive element and control techniques for operating the converter are described in Vinciarelli, Buck-Boost DC-DC Switching power Conversion, U.S. Pat. No. 6,788,033, Issued Sep. 7, 2004 (the "Buck-Boost Patent"). Using a switch to retain energy in an inductive element as a means of reducing noise and switching losses in switching power converters is described in Prager et al., Loss and Noise Reduction in Power Converters, U.S. Pat. No. Re. 40,072 Re-issued Feb. 19, 2008 (the "Reverse Recovery Patent") (all of which are assigned to VLT, inc. of Sunnyvale, Calif., and the entire disclosure of each is incorporated herein by reference).

Various power converter secondary-side output circuits are described in the SAC patent. Typical output circuits for supplying high-current low-voltage applications are shown in FIGS. 2A and 2B. (FIG. 2A corresponds to the output circuit shown in FIG. 15B of the SAC Patent.) Input circuitry (not shown) is used to drive the primary winding 34A (FIG. 2A), 34B (FIG. 2B) with power received from an input source (not shown). The AC from the center-tapped secondary is fed in alternate cycles to half-wave rectifiers 31A and 32A (FIG. 2A), 31B and 32B (FIG. 2B) which as shown may be MOSFET devices operated as rectifiers by a switch controller (not shown), to provide a full wave rectified output. The controlled switches 31, 32 are used as rectifiers to minimize power losses in the rectification circuitry.

In order to deliver power efficiently to high-current low-voltage loads, half-wave rectification is typically used to minimize the number of rectifiers through which the output current must flow. In order to provide a full-wave rectified output, typically the outputs of two half-wave rectifiers fed by oppositely-phased windings (e.g. a center-tapped winding) are connected in parallel. In the center-tapped output circuits shown in FIGS. 2A and 2B, half of the average output current flows through each switch thereby reducing power losses in the rectifiers over full bridge configurations in which the output current must flow through two switches. For this reason, particularly for supplying low voltage loads such as 5V, 3V, 1V, or less, half-wave rectification has been the standard.

SUMMARY

In one aspect, in general, a method of converting power via a transformer for supplying a low voltage output is provided. The method includes providing a secondary winding having a first terminal and a second terminal; providing a first switch and a second switch each adapted to block current flow in an OFF state in at least one direction; forming a first series circuit with the first switch connected to the second switch at a first junction, the first series circuit having two end terminals; connecting the first terminal of the secondary winding to the first junction; connecting the first series circuit across the output with each of the two end terminals connected to a respective terminal of the output and with each of the first and second switches being arranged in the OFF state to block current flow through the first series circuit in a direction that would short the output, wherein a short across one of the first or second switches does not short the output; preventing the first switch from turning ON if the second switch fails to open; and preventing the second switch from turning ON if the first switch fails to open.

Implementations of the method may include one or more of the following features. The method further includes sensing across each of the first and second switches, a respective voltage polarity; and turning each of the first and second switches ON when the sensed voltage polarity across the respective switch includes a first polarity and OFF when the sensed voltage polarity across the respective switch includes a second polarity, wherein the second polarity is opposite the first polarity. The method further includes providing a third switch and a fourth switch each adapted to block current in an OFF state in at least one direction; forming a second series circuit with the third switch connected to the fourth switch at a second junction, the second series circuit having two end terminals; connecting the second terminal of the secondary winding to the second junction; and connecting the second series circuit across the output with each of the two end terminals connected to a respective terminal of the output and with each of the third and fourth switches being arranged in the OFF state to block current flow through the second series circuit in a direction that would short the output, wherein a short across one of the third or fourth switches does not short the output. The method further includes: preventing the third switch from turning ON if the fourth switch fails to open; preventing the fourth switch from turning ON if the third switch fails to open. The method further includes: sensing across each of the third and fourth switches, a respective voltage polarity; and turning each of the third and fourth switches ON when the sensed voltage polarity across the respective switch includes a first polarity and OFF when the sensed voltage polarity across the respective switch includes a second polarity, wherein the second polarity is opposite the first polarity. The method further includes: providing a first control circuit to operate the first switch; providing power to operate the first control circuit and first switch from across the third switch; providing a third control circuit to operate the third switch; and providing power to operate the third control circuit and third switch from across the first switch. The method further includes: providing a common-source dual MOSFET semiconductor device including a first MOSFET and a third MOSFET integrated on a semiconductor die; providing a common source terminal for connecting to the first and third MOSFETs in the common-source dual MOSFET semiconductor device; and using the first MOSFET and the third MOSFET of the common-source dual MOSFET semiconductor device for the first and third switches. The method further includes integrating the first and third control circuits in the common-source dual MOSFET semiconductor device. The method further includes: providing a plurality of individual first and third MOSFET elements on the semiconductor die; arranging the individual first and third MOSFET elements in an alternating pattern on the semiconductor die; connecting the first MOSFET elements together to form the first MOSFET; connecting the third MOSFET elements together to form the third MOSFET; and using a common source metallization to interconnect the source terminals of the first and third MOSFET elements. The common-source dual MOSFET semiconductor device has exactly three terminals. The method further includes: providing a second control circuit to operate the second switch; providing power to operate the second control circuit and second switch from across the fourth switch; providing a fourth control circuit to operate the fourth switch; and providing power to operate the fourth control circuit and fourth switch from across the second switch. The method further includes: providing a first common-source dual MOSFET semiconductor device including a first MOSFET and a third MOSFET integrated on a first semiconductor die; providing a common source terminal for connecting to the first and third MOSFETs in the first common-source dual MOSFET semiconductor device; using the first MOSFET and the third MOSFET of the first common-source dual MOSFET semiconductor device for the first and third switches; providing a second common-source dual MOSFET semiconductor device including a second MOSFET and a fourth MOSFET integrated on a second semiconductor die; providing a common source terminal for connecting to the second and fourth MOSFETs in the second common-source dual MOSFET semiconductor device; using the second MOSFET and the fourth MOSFET of the second common-source dual MOSFET semiconductor device for the second and fourth switches. The method further includes: integrating the first and third control circuits in the first common-source dual MOSFET semiconductor device; and integrating the second and fourth control circuits in the second common-source dual MOSFET semiconductor device. The method further includes: providing a plurality of individual first and third MOSFET elements on the first semiconductor die; arranging the individual first and third MOSFET elements in an alternating pattern on the first semiconductor die; connecting the first MOSFET elements together to form the first MOSFET; connecting the third MOSFET elements together to form the third MOSFET; using a common source metallization to interconnect the source terminals of the first and third MOSFET elements; providing a plurality of individual second and fourth MOSFET elements on the second semiconductor die; arranging the individual second and fourth MOSFET elements in an alternating pattern on the second semiconductor die; connecting the second MOSFET elements together to form the second MOSFET; connecting the fourth MOSFET elements together to form the fourth MOSFET; and using a common source metallization to interconnect the source terminals of the second and fourth MOSFET elements. The first and second common-source dual MOSFET semiconductor devices each have exactly three terminals. The method further includes: forming a second series circuit with a first capacitor connected to a second capacitor at a second junction, the second series circuit having two end terminals; connecting the second terminal of the secondary winding to the second junction; and connecting the second series circuit across the output with each of the two end terminals connected to a respective terminal of the output. The method further includes: sensing across each of the switches, a respective voltage polarity; and turning each of the switches ON when the sensed voltage polarity across the respective switch includes a first polarity and OFF when the sensed voltage polarity across the respective switch includes a second polarity, wherein the second polarity is opposite the first polarity.

In another aspect, in general, a method of providing fault tolerance in a power converter includes: supplying an alternating current from a secondary winding to an input of a full-bridge rectifier circuit having switches, operating the switches as rectifiers to provide full-wave rectification of the alternating current at an output of the full-bridge rectifier circuit, connecting the output of the full-bridge rectifier circuit to an output of the power converter, monitoring selected circuit conditions, determining from the selected circuit conditions whether a predetermined fault is present, disabling the switches in response to a determination that the predetermined fault is present, and providing a first one of the switches connected in series with a second one of the switches across the output with the first switch connected to a first terminal of the output and the second switch connected to a second terminal of the output.

Implementations of the method may include one or more of the following features. The method further includes: sensing across each of the first and second switches, a respective voltage polarity; and turning each of the first and second switches ON when the sensed voltage polarity across the respective switch includes a first polarity and OFF when the sensed voltage polarity across the respective switch includes a second polarity, wherein the second polarity is opposite the first polarity. The method further includes: providing a third one of the switches and a fourth one of the switches each adapted to block current in an OFF state in at least one direction; forming a second series circuit with the third switch connected to the fourth switch at a second junction, the second series circuit having two end terminals; connecting the second terminal of the secondary winding to the second junction; and connecting the second series circuit across the output with each of the two end terminals connected to a respective terminal of the output and with each of the third and fourth switches being arranged in the OFF state to block current flow through the second series circuit in a direction that would short the output, wherein a short across one of the third or fourth switches does not short the output. The method further includes: preventing the third switch from turning ON if the fourth switch fails to open; and preventing the fourth switch from turning ON if the third switch fails to open. The method further includes: sensing across each of the third and fourth switches, a respective voltage polarity; and turning each of the third and fourth switches ON when the sensed voltage polarity across the respective switch includes a first polarity and OFF when the sensed voltage polarity across the respective switch includes a second polarity, wherein the second polarity is opposite the first polarity. The method further includes: providing a first control circuit to operate the first switch; providing power to operate the first control circuit and first switch from across the third switch; providing a third control circuit to operate the third switch; and providing power to operate the third control circuit and third switch from across the first switch. The method further includes: providing a common-source dual MOSFET semiconductor device including a first MOSFET and a third MOSFET integrated on a semiconductor die; providing a common source terminal for connecting to the first and third MOSFETs in the common-source dual MOSFET semiconductor device; and using the first MOSFET and the third MOSFET of the common-source dual MOSFET semiconductor device for the first and third switches. The method further includes integrating the first and third control circuits in the common-source dual MOSFET semiconductor device. The method further includes: providing a plurality of individual first and third MOSFET elements on the semiconductor die; arranging the individual first and third MOSFET elements in an alternating pattern on the semiconductor die; connecting the first MOSFET elements together to form the first MOSFET; connecting the third MOSFET elements together to form the third MOSFET; and using a common source metallization to interconnect the source terminals of the first and third MOSFET elements. The common-source dual MOSFET semiconductor device has exactly three terminals. The method further includes: providing a second control circuit to operate the second switch; providing power to operate the second control circuit and second switch from across the fourth switch; providing a fourth control circuit to operate the fourth switch; and providing power to operate the fourth control circuit and fourth switch from across the second switch. The method further includes: providing a first common-source dual MOSFET semiconductor device including a first MOSFET and a third MOSFET integrated on a first semiconductor die; providing a common source terminal for connecting to the first and third MOSFETs in the first common-source dual MOSFET semiconductor device; using the first MOSFET and the third MOSFET of the first common-source dual MOSFET semiconductor device for the first and third switches; providing a second common-source dual MOSFET semiconductor device including a second MOSFET and a fourth MOSFET integrated on a second semiconductor die; providing a common source terminal for connecting to the second and fourth MOSFETs in the second common-source dual MOSFET semiconductor device; and using the second MOSFET and the fourth MOSFET of the second common-source dual MOSFET semiconductor device for the second and fourth switches. The method further includes: integrating the first and third control circuits in the first common-source dual MOSFET semiconductor device; and integrating the second and fourth control circuits in the second common-source dual MOSFET semiconductor device. The method further includes: providing a plurality of individual first and third MOSFET elements on the first semiconductor die; arranging the individual first and third MOSFET elements in an alternating pattern on the first semiconductor die; connecting the first MOSFET elements together to form the first MOSFET; connecting the third MOSFET elements together to form the third MOSFET; using a common source metallization to interconnect the source terminals of the first and third MOSFET elements; providing a plurality of individual second and fourth MOSFET elements on the second semiconductor die; arranging the individual second and fourth MOSFET elements in an alternating pattern on the second semiconductor die; connecting the second MOSFET elements together to form the second MOSFET; connecting the fourth MOSFET elements together to form the fourth MOSFET; and using a common source metallization to interconnect the source terminals of the second and fourth MOSFET elements. The first and second common-source dual MOSFET semiconductor devices each have exactly three terminals.

In another aspect, in general, a semiconductor device includes: a first electronic switch having a first control terminal, a first switched terminal, and a first common terminal; a second electronic switch having a second control terminal, a second switched terminal, and a second common terminal; a first control circuit having an input connected to the first switched terminal and the first common terminal and an output connected to the first control terminal, the first control circuit being adapted to turn the first switch ON and OFF in response to a first voltage across the first switched terminal and the first common terminal; a second control circuit having an input connected to the second switched terminal and the second common terminal and an output connected to the second control terminal, the second control circuit being adapted to turn the second switch ON and OFF in response to a second voltage across the second switched terminal and the second common terminal; and a package having at least three terminals including one terminal connected to the first switched terminal, another terminal connected to the second switched terminal, and a common terminal connected to the first common terminal and the second common terminal; wherein the first control circuit is connected to receive power from the second switched terminal; and the second control circuit is connected to receive power from the first switched terminal.

Implementations of the semiconductor device may include one or more of the following features. The first and second electronic switches are formed in a common monolithic semiconductor die; the first and second electronic switches respectively includes a plurality of first and second switch elements; the first and second switch elements each have a respective G terminal, S terminal, and D terminal; and the S terminals of the first and second switch elements are connected together on the semiconductor die. The first and second switch elements are arranged in an alternating pattern on the semiconductor die. The first and second control circuits are also formed in the common monolithic semiconductor die. Each of the first control circuit has an offset and a gain that are configured to ensure that the first switch is turned ON when the voltage across the first switched terminal and the first common terminal is above a first predetermined threshold, and fully ON when the voltage across the first switched terminal and the first common terminal is above a second predetermined threshold.

In another aspect, in general, a semiconductor device includes: a semiconductor die including a multiplicity of switch elements each having a respective G terminal, S terminal, and D terminal; a first electronic switch and a second electronic switch respectively including a first plurality and a second plurality of the switch elements; the switch elements of the first plurality being arranged in an alternating pattern with the switch elements of the second plurality on the semiconductor die; the S terminals of the switch elements of the first and second pluralities being connected together on the semiconductor die; the first electronic switch having a first control terminal connected to the G terminals of the switch elements of the first plurality and a first switched terminal connected to the D terminals of the switch elements of the first plurality; a second electronic switch having a second control terminal connected to the G terminals of the switch elements of the second plurality and a second switched terminal connected to the D terminals of the switch elements of the second plurality; a first control circuit having an input connected to the first switched terminal and the common terminal and an output connected to the first control terminal, the first control circuit being adapted to turn the first switch ON and OFF in response to a first voltage across the first switched terminal and the common terminal; and a second control circuit having an input connected to the second switched terminal and the common terminal and an output connected to the second control terminal, the second control circuit being adapted to turn the second switch ON and OFF in response to a second voltage across the second switched terminal and the common terminal.

Implementations of the semiconductor device may include one or more of the following features. The first and second control circuits are also formed in the common monolithic semiconductor die. The semiconductor device further includes: a package including one terminal connected to the first switched terminal, another terminal connected to the second switched terminal, and a third terminal connected to the common terminal. The package further includes a fourth terminal connected to supply power to the first and second control circuits. The first control circuit is connected to receive power from the second switched terminal; and the second control circuit is connected to receive power from the first switched terminal. The package includes exactly three terminals.

In another aspect, in general, a fault-tolerant converter includes: a transformer having a primary winding and a secondary winding, the secondary winding having a first terminal and a second terminal; a first series circuit having a first switch and a second switch each adapted to block current flow in an OFF state in at least one direction, the first switch being connected to the second switch at a first junction, the first series circuit having two end terminals, the first junction being connected to the first terminal of the secondary winding, the first series circuit being connected across an output of the converter with each of the two end terminals connected to a respective terminal of the output and with each of the first and second switches being arranged in the OFF state to block current flow through the first series circuit in a direction that would short the output, wherein a short across one of the first or second switches does not short the output; and a switch control circuit configured to prevent the first switch from turning ON if the second switch fails to open, and to prevent the second switch from turning ON if the first switch fails to open.

Implementations of the fault-tolerant converter may include one or more of the following features. The switch control circuit is configured to sense across each of the first and second switches, a respective voltage polarity, and to turn each of the first and second switches ON when the sensed voltage polarity across the respective switch includes a first polarity and OFF when the sensed voltage polarity across the respective switch includes a second polarity, wherein the second polarity is opposite the first polarity. The fault-tolerant converter includes a second series circuit that includes a third switch and a fourth switch each adapted to block current in an OFF state in at least one direction, the third switch being connected to the fourth switch at a second junction, the second series circuit having two end terminals, the second terminal of the secondary winding being connected to the second junction, the second series circuit being connected across the output with each of the two end terminals connected to a respective terminal of the output and with each of the third and fourth switches being arranged in the OFF state to block current flow through the second series circuit in a direction that would short the output, wherein a short across one of the third or fourth switches does not short the output. The switch control circuit includes a first control circuit and a third control circuit, the first control circuit operates the first switch, the third control circuit operates the third switch, the first control circuit and the first switch are powered using a voltage across the third switch, and the third control circuit and third switch are powered using a voltage across the first switch. The fault-tolerant converter includes a common-source dual MOSFET semiconductor device having a first MOSFET and a third MOSFET that are integrated on a semiconductor die, the first MOSFET is used for the first switch, the third MOSFET is used for the third switch, and the common-source dual MOSFET semiconductor device has a source terminal connected to the source of the first MOSFET and the source of the third MOSFET. The switch control circuit includes a first control circuit and a third control circuit, the first control circuit operates the first switch, the third control circuit operates the third switch, the first control circuit and the first switch are powered using a voltage across the third switch, the third control circuit and the third switch are powered using a voltage across the first switch, and the first and third control circuits are integrated in the semiconductor die of the common-source dual MOSFET semiconductor device. The first MOSFET includes a plurality of individual first MOSFET elements on the semiconductor die, the third MOSFET includes a plurality of individual third MOSFET elements on the semiconductor die, the individual first and third MOSFET elements are arranged in an alternating pattern on the semiconductor die, and a common source metallization interconnects the source terminals of the first and third MOSFET elements. The common-source dual MOSFET semiconductor device has exactly three terminals that includes the source terminal, a terminal connected to the drain of the first MOSFET, and a terminal connected to the drain of the third MOSFET. The switch control circuit includes a second control circuit and a fourth control circuit, the second control circuit operates the second switch, the fourth control circuit operates the fourth switch, the second control circuit and the second switch are powered using a voltage across the fourth switch, and the fourth control circuit and fourth switch are powered using a voltage across the second switch. The fault-tolerant converter includes: a first common-source dual MOSFET semiconductor device that includes a first MOSFET and a third MOSFET integrated on a first semiconductor die, the first common-source dual MOSFET semiconductor device including a common source terminal for connecting to the first and third MOSFETs, wherein the first MOSFET and the third MOSFET are used for the first and third switches; and a second common-source dual MOSFET semiconductor device that includes a second MOSFET and a fourth MOSFET integrated on a second semiconductor die, the second common-source dual MOSFET semiconductor device including a common source terminal for connecting to the second and fourth MOSFETs, wherein the second MOSFET and the fourth MOSFET are used for the second and fourth switches. The first and third control circuits are integrated on the first semiconductor die, and the second and fourth control circuits are integrated on the second semiconductor die. The first MOSFET includes a plurality of individual first MOSFET elements on the first semiconductor die, the third MOSFET includes a plurality of individual third MOSFET elements on the first semiconductor die, the individual first and third MOSFET elements are arranged in an alternating pattern on the first semiconductor die, a common source metallization interconnects the source terminals of the first and third MOSFET elements, the second MOSFET includes a plurality of individual second MOSFET elements on the second semiconductor die, the individual second and fourth MOSFET elements are arranged in an alternating pattern on the second semiconductor die, and a common source metallization interconnects the source terminals of the second and fourth MOSFET elements. The first common-source dual MOSFET semiconductor device has exactly three terminals that includes the common source terminal, a terminal connected to the drain of the first MOSFET, and a terminal connected to the drain of the third MOSFET, and the second common-source dual MOSFET semiconductor device has exactly three terminals that includes the common source terminal, a terminal connected to the drain of the second MOSFET, and a terminal connected to the drain of the fourth MOSFET. The fault-tolerant converter includes a second series circuit having a first capacitor connected to a second capacitor at a second junction that is connected to the second terminal of the secondary winding, the second series circuit having two end terminals connected across the output of the converter with each of the two end terminals connected to a respective terminal of the output of the converter. The switch control circuit is configured to sense across each of the first, second, third, and fourth switches, a respective voltage polarity, and to turn each of the first, second, third, and fourth switches ON when the sensed voltage polarity across the respective switch includes a first polarity and OFF when the sensed voltage polarity across the respective switch includes a second polarity, wherein the second polarity is opposite the first polarity.

In another aspect, in general, a multi-cell power converter includes: a plurality of input cells having inputs connected in parallel with an input, and connected to drive parallel respective primary windings of a transformer with power received from the input, the input cells forming a power-sharing array of cells in which if one of the input cells fails, the converter continues to process power through remaining functional input cell or cells; a plurality of output circuits to receive power from respective secondary windings of the transformer, the output circuits having outputs that are connected in parallel to provide an output voltage to a load, the output circuits forming a power-sharing array in supplying power to the output in which if one of the output circuits fails, the converter continues to process power through remaining functional output circuit or circuits; and a switch control circuit; wherein each of the output circuits includes a first series circuit having a first switch and a second switch each adapted to block current flow in an OFF state in at least one direction, the first switch is connected to the second switch at a first junction, the first series circuit has two end terminals, the first junction is connected to a first terminal of the respective secondary winding, the first series circuit is connected across an output of the converter with each of the two end terminals connected to a respective terminal of the output and with each of the first and second switches being arranged in the OFF state to block current flow through the first series circuit in a direction that would short the output, and a short across one of the first or second switches does not short the output; and wherein the switch control circuit is configured to prevent the first switch in each output circuit from turning ON if the second switch in the output circuit fails to open, and to prevent the second switch in the output circuit from turning ON if the first switch in the output circuit fails to open.

Implementations of the multi-cell power converter may include one or more of the following features. The switch control circuit is configured to sense across each of the first and second switches in each of the output circuits, a respective voltage polarity, and to turn each of the first and second switches ON when the sensed voltage polarity across the respective switch includes a first polarity and OFF when the sensed voltage polarity across the respective switch includes a second polarity, wherein the second polarity is opposite the first polarity.

In another aspect, in general, a method is provided for converting power received from an input source at an input voltage via a transformer for delivery via an output at an output voltage to a load, where the load may vary over a normal operating range. The method includes: using an input circuit having a plurality of primary switches to drive a primary winding of the transformer with power received from the input source; using output circuitry having a plurality of secondary switches for rectifying power received from a secondary winding of the transformer to conduct current from the secondary winding to the output; operating the primary switches in a series of converter operating cycles, each converter operating cycle characterized by (a) two power transfer phases of essentially equal duration during which (i) one or more of the primary switches are ON, (ii) a primary winding of the transformer is driven with power received from the input, (iii) a magnetizing current flows through the primary winding and increases in magnitude, and (iv) power is transferred between the input and the output via the transformer; and (b) a clamp phase during which a winding of the transformer is clamped, the clamp phase being characterized by (i) essentially zero voltage across the clamped winding and (ii) an average value of current flowing in the clamped winding, the average value of current having a polarity, wherein the average is taken over the duration of the clamp phase, and the polarity is the same as a polarity of an average value of current flowing in the clamped winding during the power transfer phase immediately preceding the clamp phase, and (iii) essentially zero current is conducted between the secondary winding and the output.

Implementations of the method may include one or more of the following features. The method further includes: forming a resonant circuit including the transformer and having a characteristic resonant frequency and period; wherein a resonant current flows in the primary winding during the power transfer phases; and turning one or more primary switches OFF essentially at times when the resonant current returns to zero. Each converter operating cycle further includes a plurality of energy-recycling intervals during which at least one primary switch transitions to OFF; and the method further includes using the magnetizing current to charge and discharge capacitances during the energy-recycling intervals. The method further includes using an inductance to limit the rate of change of current in the transformer; and wherein the primary and secondary switches are operated in the series of converter operating cycles and each converter operating cycle further includes: a freewheel phase during which a circuit including a winding of the transformer is clamped, the freewheel phase being characterized by (i) essentially zero voltage across the clamped circuit and (ii) an average value of current flowing in the clamped circuit, the average value of current having a polarity, wherein the average is taken over the duration of the initial clamp phase, and the polarity is the same as a polarity of an average value of current flowing in the clamped winding during the power transfer interval immediately preceding the freewheel phase, (iii) a current flowing in the inductance declines in magnitude to essentially zero current, and (iv) the secondary switches conduct current between the secondary winding and the output. Each clamp phase occurs after a respective freewheel phase; and the freewheel phase ends, and the secondary switches are turned OFF, essentially when the current between the secondary winding and the output returns to zero. Each converter operating cycle further includes a plurality of energy-recycling intervals during which at least one primary switch transitions to OFF; and the method further includes using the magnetizing current to charge and discharge capacitances during the energy-recycling intervals. The method further includes: varying the duration of the clamp phase to control an effective output resistance of the power conversion. The method further includes: varying the duration of the clamp phase to regulate conversion factor defined as the ratio of input voltage to output voltage. The method further includes: varying the duration of the clamp phase to reduce power losses at light loads. The method further includes: varying the duration of the clamp phase to control the rate of change of the output voltage. The method further includes: varying the duration of the clamp phase to regulate the output voltage.

In another aspect, in general, a method of converting power received from an input source at an input voltage via transformer for supplying a load at a DC output voltage is provided. The method includes: providing a driver circuit having an input for receiving power from the source and a driver output; providing an output circuit for deployment near the load, the output circuit having an AC input and an output for supplying the DC output voltage to the load; providing a power transformer having a first winding for electrical connection to the driver output and a second winding for electrical connection to the AC input of the output circuit; forming a resonant circuit including a winding of the transformer, the resonant circuit being characterized by a characteristic resonant period; providing a power bus between the driver circuit and the power transformer; operating the driver circuit to drive the transformer in a series of converter operating cycles, each converter operating cycle characterized by two power transfer phases of essentially equal duration each having a duration less than the characteristic resonant period, during which one or more switches in the driver circuit are ON and power is transferred from the input to the output via the transformer; and deploying the driver circuit as a self-contained unit at a first location separated from the output circuit.

Implementations of the method may include one or more of the following features. The method includes deploying the output circuit as a self-contained unit that is separate from the self-contained unit of the driver circuit. The output circuit includes a first series circuit having a first switch and a second switch, the first switch being connected to the second switch at a first junction, the first series circuit having two end terminals that are connected to the output of the output circuit, and the first junction being connected to a first terminal of the second winding of the power transformer. The output circuit includes a second series circuit having a third switch and a fourth switch, the third switch being connected to the fourth switch at a second junction, the second series circuit having two end terminals that are connected to the output of the output circuit, and the second junction being connected to a second terminal of the second winding of the power transformer. The method includes deploying the first and second switches of the output circuit on a die having the load, wherein the driver circuit is located outside of the die. The load includes a processor core. The method includes providing control circuitry to operate the first and second switches of the output circuit, and deploying the control circuitry on the die having the load. The driver circuit includes a plurality of primary switches to drive the first winding of the power transformer, and a resonant current flows in the first winding during the power transfer phases, and the method includes turning one or more of the primary switches OFF essentially at times when the resonant current returns to zero. A magnetizing current flows through the primary winding during the power transfer phases, and each converter operating cycle includes a plurality of energy-recycling intervals during which at least one primary switch transitions to OFF, and the method includes using the magnetizing current to charge and discharge capacitances during the energy-recycling intervals.

In another aspect, in general, an apparatus includes: a first package includes a driver circuit having an input for receiving power from an input source and a driver output; an output circuit having an AC input and an output for supplying a DC output voltage to a load, the output circuit being disposed outside of the first package; a power transformer having a first winding for electrical connection to the driver output of the driver circuit and a second winding for electrical connection to the AC input of the output circuit; a resonant circuit formed in part by one of the windings of the transformer, the resonant circuit having a characteristic resonant period; and a power bus for electrical connection to the driver circuit and the power transformer; wherein the driver circuit is configured to drive the transformer in a series of converter operating cycles, each converter operating cycle includes two power transfer phases of essentially equal duration each having a duration less than the characteristic resonant period, during which one or more switches in the driver circuit are ON and power is transferred from the input of the driver circuit to the output of the output circuit via the transformer.

Implementations of the apparatus may include one or more of the following features. The output circuit and the power transformer are provided in a second package that is separate from the first package. The output circuit includes a first series circuit having a first switch and a second switch, the first switch being connected to the second switch at a first junction, the first series circuit having two end terminals that are connected to the output of the output circuit, and the first junction being connected to a first terminal of the second winding of the power transformer. The output circuit includes a second series circuit having a third switch and a fourth switch, the third switch being connected to the fourth switch at a second junction, the second series circuit having two end terminals that are connected to the output of the output circuit, and the second junction being connected to a second terminal of the second winding of the power transformer. The first and second switches of the output circuit are provided on a die having the load. The load includes a processor core. The apparatus includes control circuitry to operate the first and second switches of the output circuit, wherein the control circuitry is provided on the die having the load. The driver circuit includes a plurality of primary switches to drive the first winding of the power transformer, and a resonant current flows in the first winding during the power transfer phases, and wherein the apparatus includes a control circuit to operate the primary switches, and the control circuit is configured to turn OFF one or more of the primary switches essentially at times when the resonant current returns to zero.

The details of one or more embodiments of the invention are set forth in the accompanying drawings and description below. Other features, objects, and advantages of the invention will be apparent from the description and drawings, and from the claims.

DESCRIPTION OF DRAWINGS

Like references symbols in the various drawings indicate like elements.

DETAILED DESCRIPTION

I. Cycle-by-Cycle Fault Tolerance

A DC transformer delivers a DC output voltage, $V_{out}$, which is a fixed fraction of the voltage, $V_{in}$ delivered to its input. The voltage transformation ratio or voltage gain of the DC transformer (which may be defined as the ratio, $K=V_{out}/V_{in}$, of its output voltage to its input voltage at a load current) is fixed by design, e.g. by the converter topology, its timing architecture, and the turns ratio of the transformer included within it. In certain practical implementations without a feedback loop, using non-idealized components, the effective output resistance of the DC transformer will cause some droop in output voltage as a function of load current.

Figure 3:
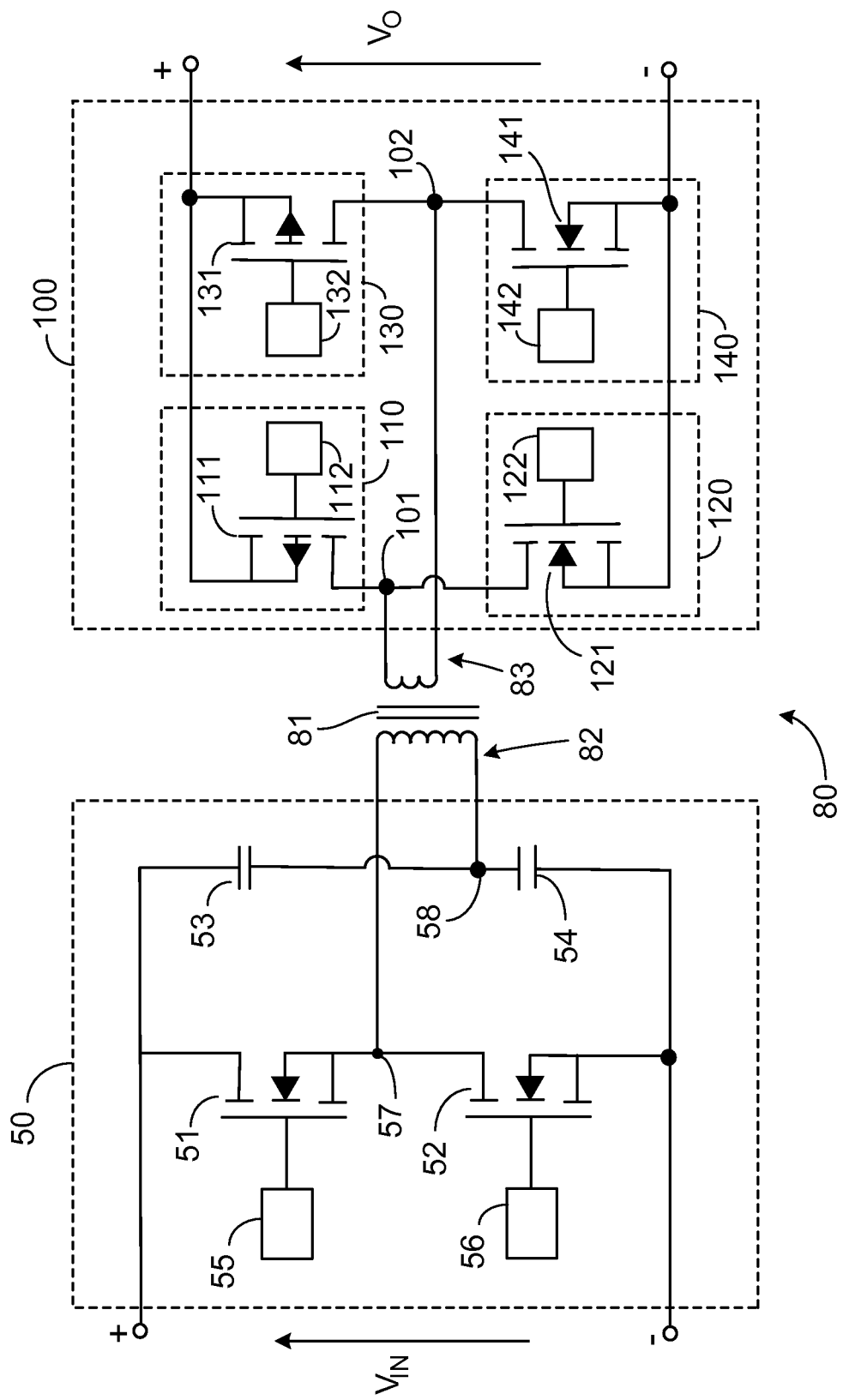
FIG. 3 shows an improved power converter having a half-bridge input circuit and a full-bridge output circuit including fault protection.

Referring to FIG. 3, an improved DC transformer topology is shown having an input circuit 50 coupled to the primary winding 82 of transformer 81, and an output circuit 100 coupled to secondary winding 83 for delivering high-current, low-voltage in fault-tolerant applications. The input circuit 50 as shown may use a half-bridge switching circuit for driving the primary winding 82 with power received from the input. Two primary switches 51, 52 are connected in a series circuit leg across the input. Two capacitors 53, 54 are also connected in a series circuit leg across the input. The primary winding is connected across the two legs, with one end of the winding connected to the junction 57 of switches 51, 52 and the other end of the winding connected to the junction 58 of capacitors 53, 54. The primary switches 51, 52 are alternately turned ON and OFF in opposition by switch controllers 55, 56 respectively. Although separate switch controllers 55, 56 are shown in FIG. 3 and referenced in the description below, the control functions may be combined in a single integrated controller, e.g. a primary side switch controller, for control of the primary switches. By appropriate selection of the capacitors 53, 54 and transformer characteristics, such as leakage inductance, the DC transformer of FIG. 3 may be operated as a SAC using the control architecture described in the SAC patent.

In operation, the primary switches 51, 52 are alternately turned ON and OFF to drive the primary winding 82 in a series of converter operating cycles. Because the voltage at the junction of the capacitors will be approximately one half of the input voltage, $V_{in}$, during steady-state operation, the half-bridge circuit 50 provides 2-to-1 voltage division at the primary of the transformer which is beneficial in low output voltage applications. Fault tolerance may be built into the input circuit 50 by preventing one primary switch from turning ON or staying ON while the opposite switch may be conducting, e.g. by sensing the voltage across the opposite switch. Switch controllers 55, 56 may therefore be configured to wait for the voltage across the opposite switch 52, 51 to increase to a level sufficient to ensure that it has turned OFF before turning its respective switch ON. Preferably, the controllers are configured to turn ON their respective switches at the occurrence of a maximum in the voltage across the opposite switch to provide zero voltage switching ("ZVS") transitions for its respective switch. Thus if one switch should short, the other switch will not turn ON or stay ON preventing the converter input 50 from creating a short across the power bus used to provide power to other converters in the system.

The fault tolerant input circuit 50 may be used to eliminate the need for a disconnect switch at the input of the converter. Additional fault tolerance functionality may be incorporated in the converter as discussed below in connection with FIG. 6.

A. Full-Bridge Output

The secondary side of converter 80 includes output circuit 100 connected to the secondary winding 83 of transformer 81. As shown, four switch rectifiers, 110, 120, 130, and 140 are connected in a full-bridge rectifier circuit. Switch Rectifiers 110, 120 and 130, 140 are connected in respective series circuit legs across the output. The secondary winding is connected across the two legs, with one end of the winding connected to the junction 101 of switches 110, 120 and the other end of the winding connected to the junction 102 of switch rectifiers 130, 140.

As shown, the switch rectifiers 110, 120, 130, 140 may each comprise a MOSFET 111, 121, 131, 141 and a switch controller 112, 122, 132, 142, respectively. Although shown as p-channel and n-channel devices capable of blocking current in one direction because of the parasitic body diodes, MOSFETS 111, 131 and 121, 141 may be configured to block current in both directions. Each switch controller may turn its respective switch ON and OFF to function as a rectifier for example by sensing the polarity of voltage across its respective switch and turning it ON for a first polarity and OFF for the opposite polarity. A two terminal synchronous rectifier is described in Vinciarelli et al, Components Having Actively, Controlled Circuit Elements, U.S. Pat. No. 6,985,341 issued Jan. 10, 2006 (assigned to VLT, Inc. Sunnyvale, Calif. and incorporated herein in its entirety). For the n-channel enhancement mode MOSFET based switch rectifiers 120, 140 shown in the example of FIG. 3, the controllers 122, 142 may turn their respective MOSFETs 121, 141 ON only if its respective source terminal becomes more positive than its drain terminal. For the p-channel enhancement mode MOSFET based switch rectifiers 110, 130 shown in the example of FIG. 3, controllers 112, 132 may turn their respective MOSFETs 111, 131 ON only if its respective source terminal becomes more negative than its drain terminal.

Because the secondary winding 83 is connected to the output through a full-bridge rectification circuit, two switches must be ON to complete the circuit. During the first half cycle, switch rectifiers 110 and 140 must be ON to complete the circuit and during the next half cycle, switch rectifiers 120 and 130 must be ON. As a result, the output circuit 100 presents potentially higher power losses in the rectifier circuit than a half-wave configuration (FIGS. 2A, 2B) for low output voltages and therefore seems disadvantageous. However, output circuit 100 has a significant advantage in its ability to decouple the failed output from the system bus 13 (FIG. 1) in the event of a fault. To prevent the output circuit 100 from creating a short across the system bus, the switches are controlled to ensure that no switch is turned ON until its complementary switch is OFF. For example, if switch rectifier 110 failed by shorting junction 101 to the positive side of the output, switch 121 would be disabled effectively isolating the fault and decoupling the converter output from the system bus.

The polarity sensing switched rectifiers described above ensure that the switches will not short the output. For example if switch rectifier 110 failed by shorting junction 101 to the positive side of the output, the source of MOSFET 121, which is connected to the negative side of the output, cannot become more positive than its drain, which, being connected to junction 101, has been shorted by failed switched rectifier 110 to the positive output. Therefore, switch rectifier 120 will remain OFF. Similarly, if switch rectifier 120 failed by shorting junction 101 to the negative side of the output, the source of MOSFET 111 which is connected to the positive output terminal cannot become more positive than its drain, which being connected to junction 101 has been shorted by failed switched rectifier 120 to the negative output. Therefore, switch rectifier 110 will remain OFF. The same fault tolerant control protocol prevents a short across the output by the other series circuit leg. In this way, the fault tolerant output circuit 100 ensures that a single switch fault will not produce a short across the output.

The output circuit may continue to operate for half-wave rectification even in the event of a shorted switch. For example, with switch rectifier 110 shorted, switch rectifier 120 would be disabled, however, switch rectifier 140 could continue to operate normally turning ON during half-cycles having a polarity that supplies power to the output and OFF for the alternate half-cycles. With switches capable of blocking current in both directions the converter could continue to operate in such a half-wave mode.

However, caution should be exercised if switches capable of blocking current in only one direction, such as those shown schematically in FIG. 3, are used. For output voltages greater than the forward voltage drop of the body diodes, the body diode may clamp the secondary winding. Assume for example that switch rectifier 110 is shorted with the converter continuing to operate. Although switch rectifier 120 will remain OFF preventing a short across the output, the body diode of MOSFET 131 will clamp the secondary during the half cycles in which switch 120 would normally be ON to its forward voltage. Switches capable of blocking current in both directions are therefore necessary in applications where the output voltage is greater than the forward voltage of the body diodes if the converter is allowed to continue to operate after a fault.

Figure 1:
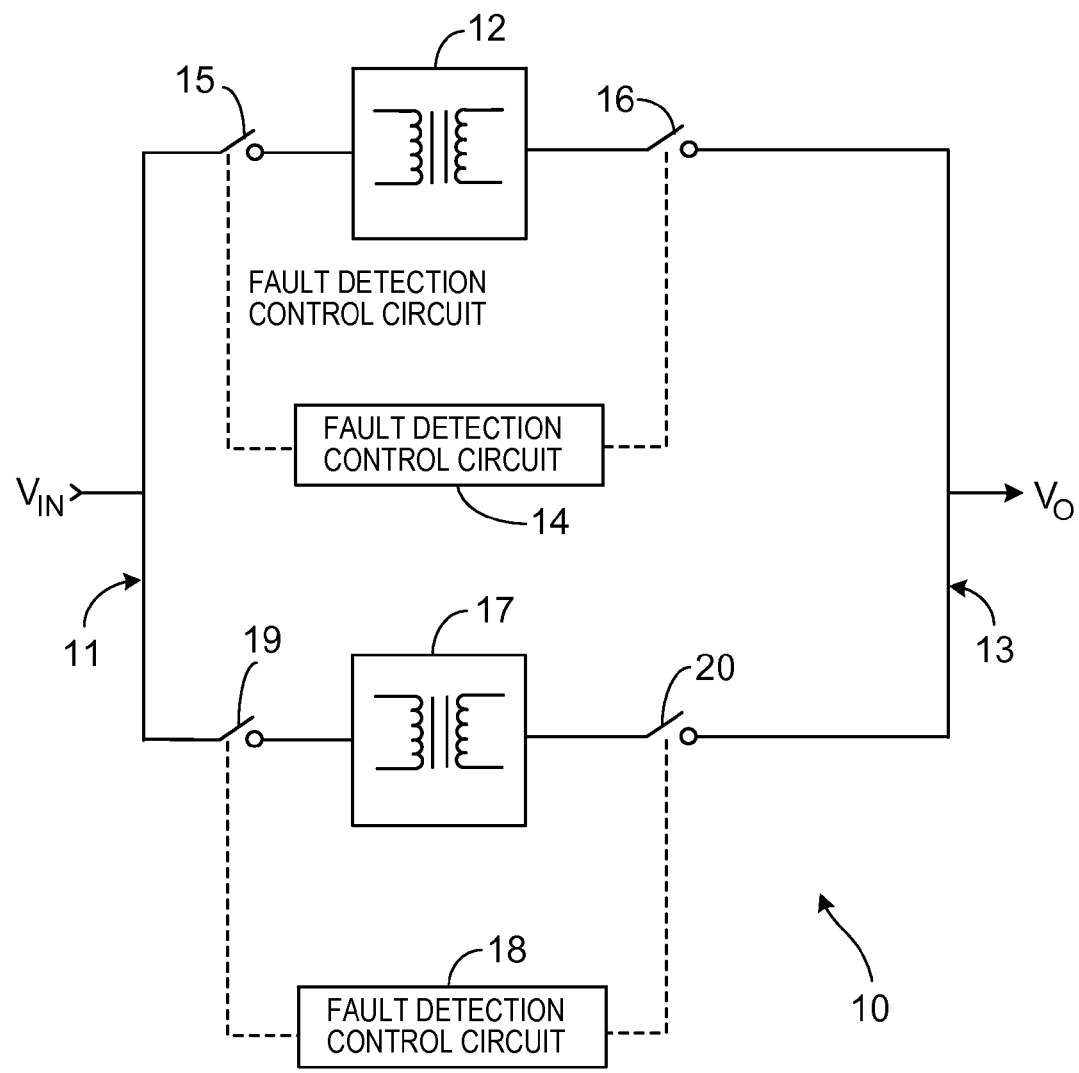
FIG. 1 shows a block diagram of a prior-art fault-tolerant power system.
Figure 2A:
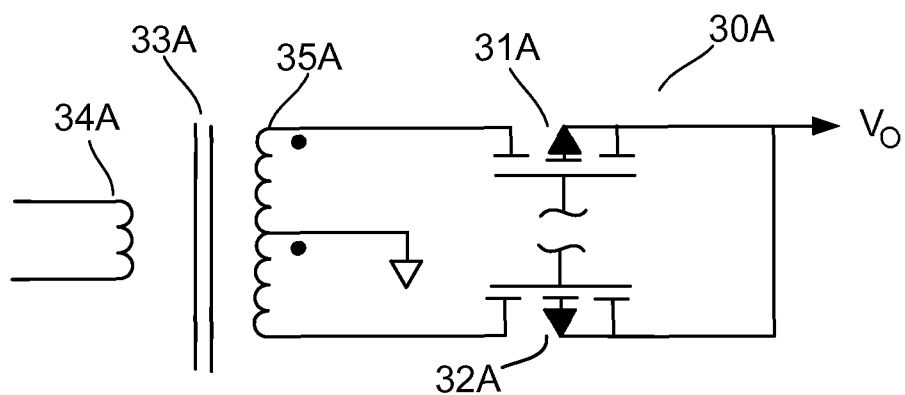
FIG. 2A shows the output circuitry portion of a prior art power converter.
Figure 2B:
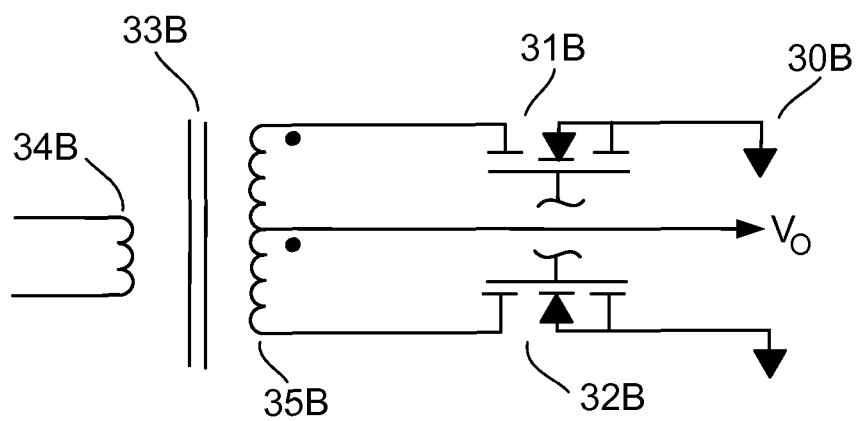
FIG. 2B shows the output circuitry portion of a prior art power converter.

Because fault isolation is provided in the rectification circuit, the output circuit 100 (FIG. 3) of the converter may be connected directly to the system bus 13 (FIG. 1), avoiding the need for an additional isolation switch, e.g. 16, 20 (FIG. 1). Although the number of switches required on the output side increases from 3 to 4 and the output current still passes through two switches, the full-bridge fault-tolerant output circuit eliminates the need for an external fault detection and isolation circuit, saving system space and complexity. Additionally, the breakdown voltage rating for the output switches may be reduced by a factor of two: 2*Vo for the prior art half-wave rectified output vs. Vo in the full-bridge fault-tolerant output 100 of FIG. 3. Lower breakdown voltage MOSFETs tend to have lower ON resistance, which offers lower power loss in the full-bridge fault-tolerant output circuit 100. As discussed below, lowering the breakdown voltage to Vo may allow the MOSFETs to be integrated onto the same die as the circuitry to which it is supplying power such as a processor core. Furthermore, the full-wave rectified output of FIG. 3 requires half as many turns in the secondary winding than in the winding of the center-tapped half-wave rectified output (FIGS. 2A, 2B), which allows a larger gauge conductor, or a larger multiplicity of parallel conductors, to be used in the secondary winding potentially reducing secondary conduction losses. At low output voltages and high currents utilizing low resistance switch rectifiers, the winding losses can exceed the losses in the switch rectifiers favoring the fault-tolerant full-bridge output circuit.

B. Half-Bridge Output

Figure 4:
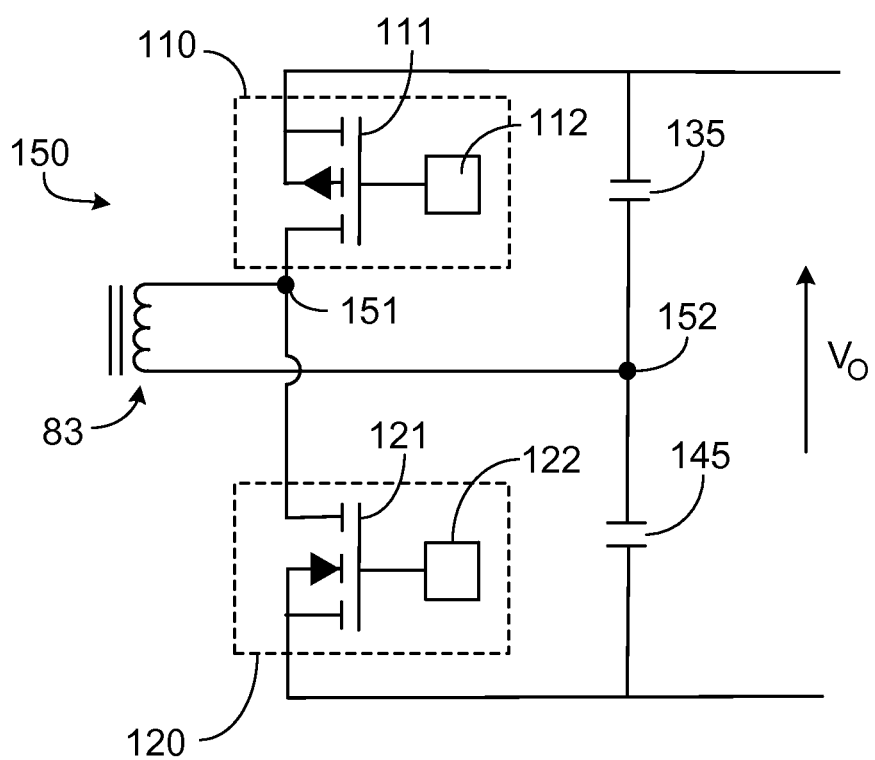
FIG. 4 shows an improved half-bridge output circuit for a power converter including fault protection.

Referring to FIG. 4, a half-bridge fault-tolerant output circuit 150 is shown connected to secondary winding 83. In contrast to the output circuit of FIG. 3, only two switch rectifiers 110, 120 are shown in FIG. 4 forming a half-bridge rectifier for secondary winding 83. Like output circuit 100 (FIG. 3), switch rectifiers 110, 120 are connected in a series circuit leg across the output. However, voltage doubling capacitors 135, 145 (FIG. 4) are connected in a series circuit leg across the output in place of switch rectifiers 130, 140 of FIG. 3. The secondary winding is connected across the two legs, with one end of the winding connected to the junction 151 of switches 110, 120 and the other end of the winding connected to the junction 152 of capacitors 135, 145. The output circuit of FIG. 4 uses half as many switches as the output circuit 100 of FIG. 3, but also produces twice the output voltage which may be disadvantageous in low voltage applications.

Each switch rectifier 110, 120 may, as described above in connection with FIG. 3, include a MOSFET 111, 121 and a switch controller 112, 122 to turn their respective switches ON and OFF to function as rectifiers. For the n-channel enhancement mode MOSFET device 120, the controller 122 may turn MOSFET 121 ON only when its source terminal becomes more positive than its drain terminal. For the p-channel enhancement mode MOSFET device 110, the controller 112 may turn MOSFET 1110N only when its respective source terminal becomes more negative than its drain terminal. With the switch rectifiers 110, 120 functioning as rectifiers, a short failure in either switch will prevent the other switch from turning ON to create a short across the output. Similarly, in the unlikely event of a short in either capacitor, the other capacitor will prevent a short across the output and the switches will remain reverse biased and OFF.

Figure 6:
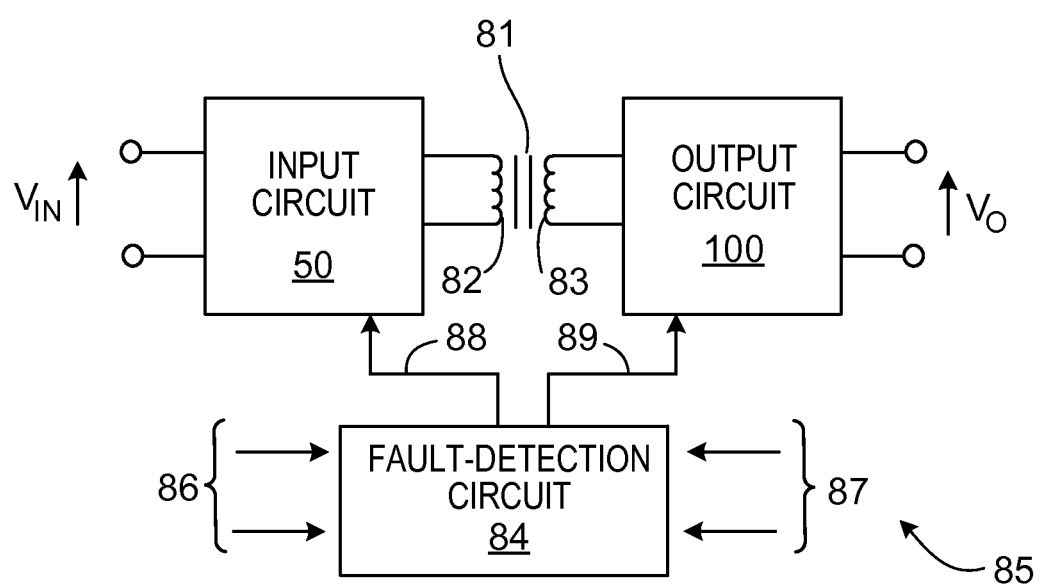
FIG. 6 shows a fault tolerant power converter.
Figure 11:
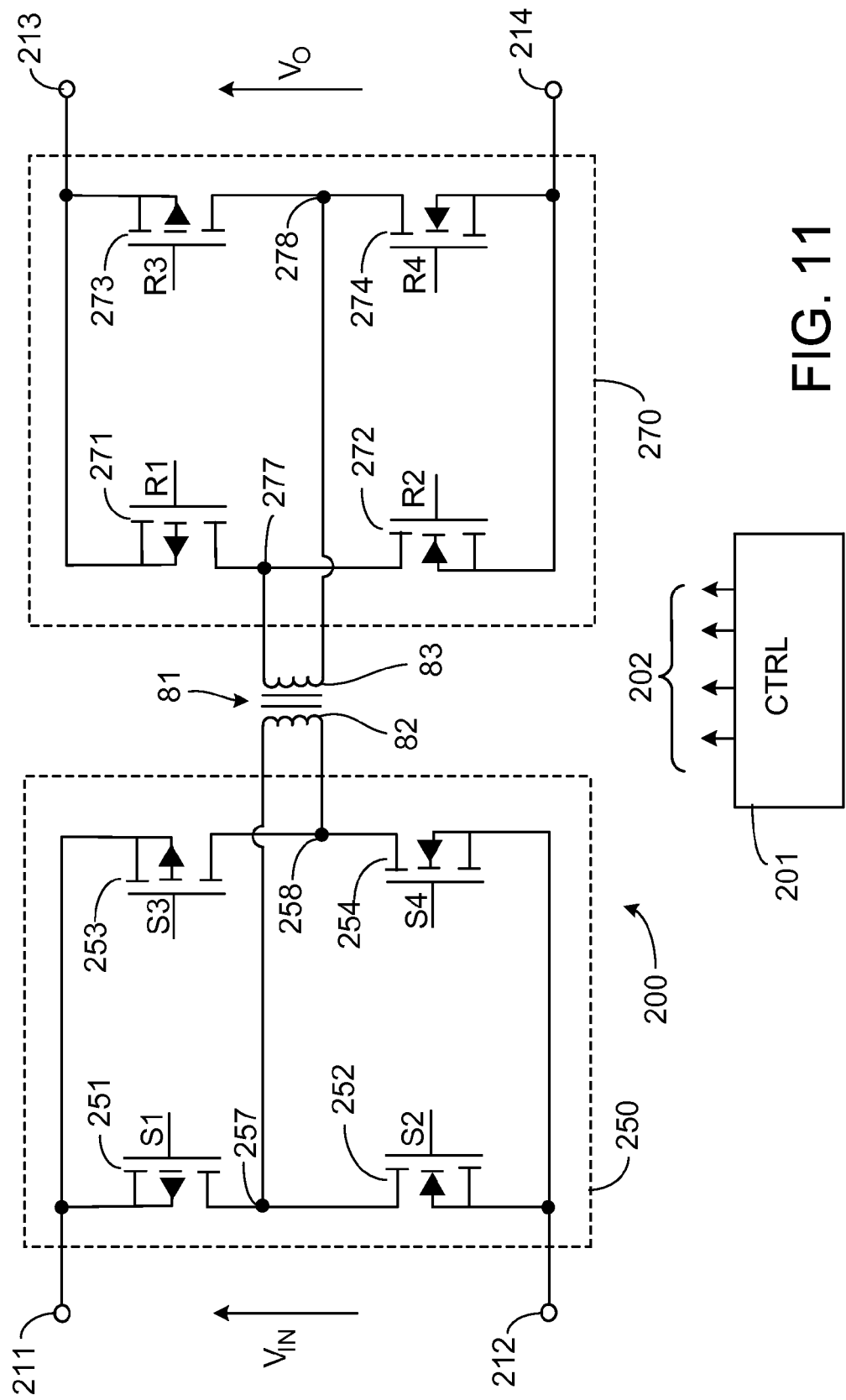
FIG. 11 shows the schematic of an improved fault-tolerant power converter.
Figure 14:
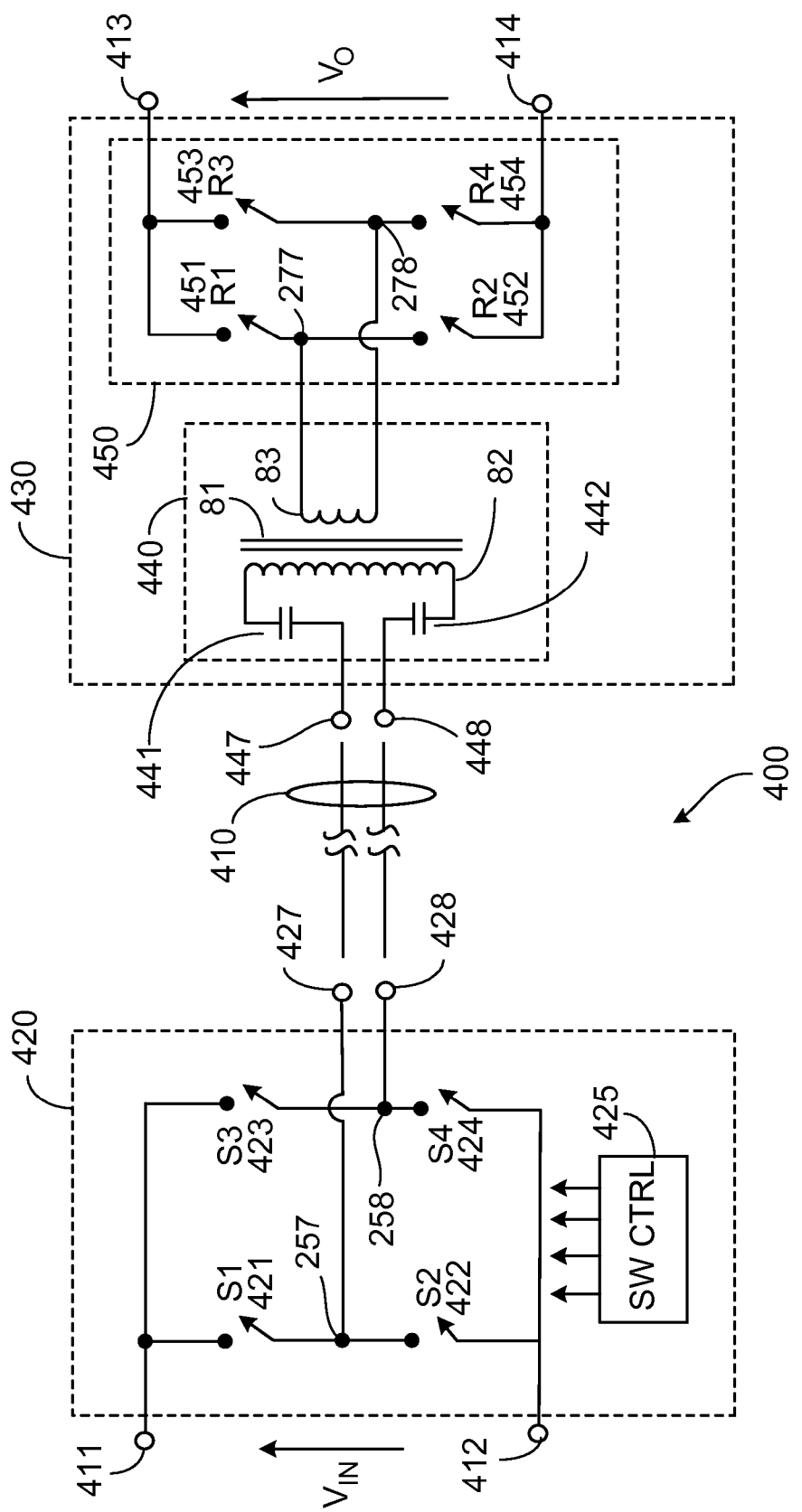
FIG. 14 shows a modular fault-tolerant converter based on the SAC topology.

Output circuits 100, 150 may be used together with a half-bridge input circuit 50 or a full bridge input circuit (such as shown in FIGS. 11, 14 and discussed below) to provide fault tolerance in a power converter without requiring disconnect switches such as input disconnect switches 15, 19 and output disconnect switches 16, 20 shown in FIG. 1. Each switch controller 55, 56, 112, 122, 132, 142 may include a disable input (not shown) for receiving a disable signal in response to which each switch controller would turn OFF its respective switch(es) for over-riding normal operation. Referring to FIG. 6, a power converter 85, similar to the converter 80 of FIG. 3, is shown including an input circuit 50 coupled to an output circuit 100 via transformer 81. The power converter 85 as shown includes a fault-detection circuit 84 having a plurality of inputs 86, 87 for monitoring operating conditions, such as voltage transitions and voltages across one or more switches, output voltage, input voltage, temperature, etc. in the converter for detecting faults such as a switch failure, over-temperature, over voltage, etc. For example, the fault detection circuit 84 may monitor input nodes 57, 58 or output nodes 101, 102 for voltage transitions and voltages across switches. The failure of one node to complete a voltage transition or exhibit a certain voltage polarity may signal a switch failure in response to which the detection circuit 84 may disable the converter. In operation, in response to a detected fault condition, the fault-detection circuit 84 may send a disable signal to the disable input 88 of the primary side switch controllers 55, 56 and the disable input 89 of switch rectifiers 110, 120, 130, 140 in response to which each controller may turn its respective switches OFF. Although output circuit 100 is shown in FIG. 6, output circuit 150 may be used instead.

II. Cell-by-Cell Fault Tolerance

Figure 5:
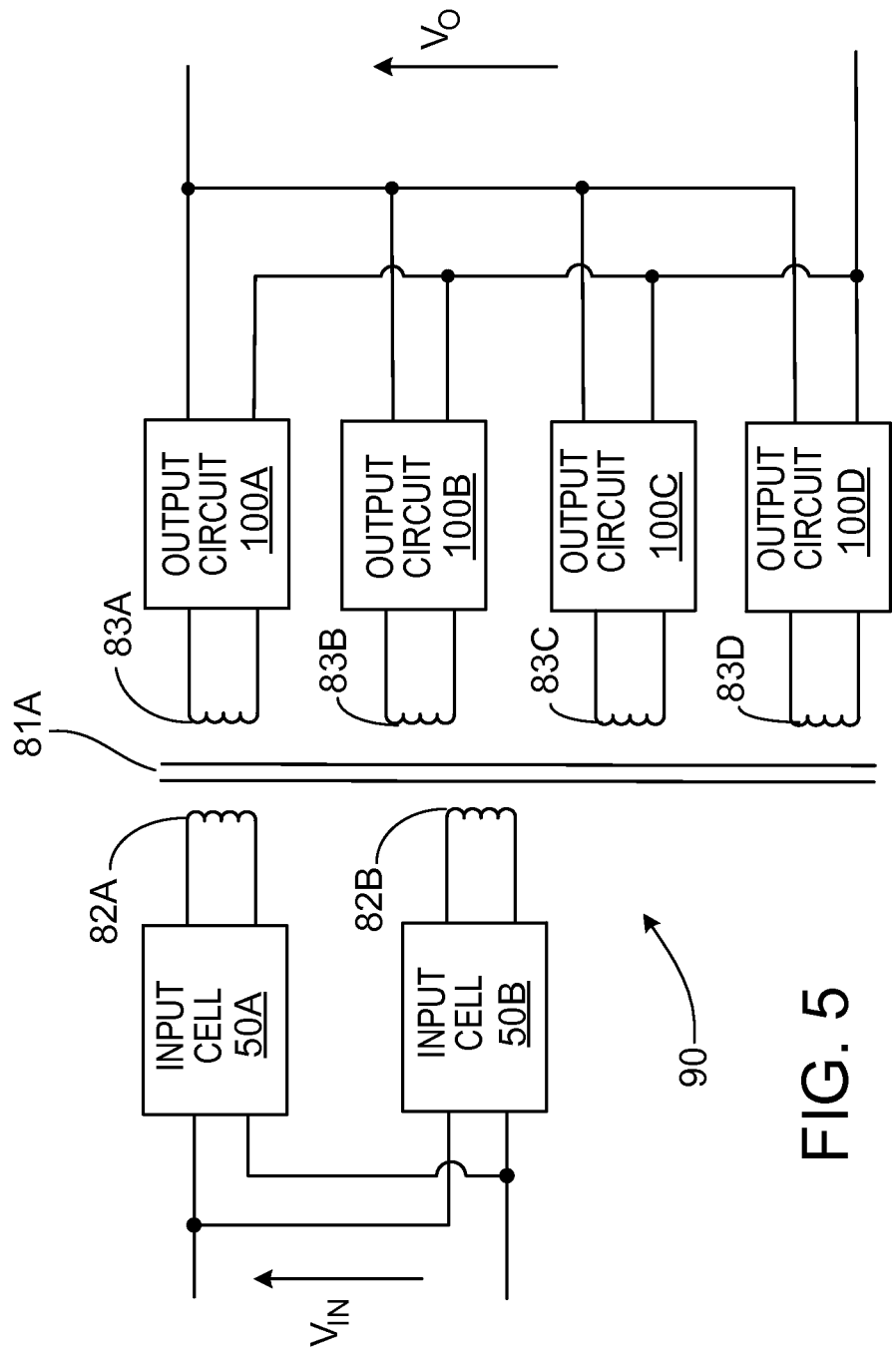
FIG. 5 shows a multi-cell power converter including fault protection.

Referring to FIG. 5, a multi-cell power converter 90 is shown having two input cells 50A, 50B having inputs connected in parallel with an input, $V_{in}$, and connected to drive parallel primary windings 82A, 82B respectively with power received from the input. Four secondary windings 83A-83D coupled to the primary windings via transformer 81A are connected to a respective output circuit 100A-100D, the outputs of which are connected in parallel to provide an output voltage, $V_o$ to a load (not shown). All of the input circuits 50 may employ the same topology, e.g. half-bridge as shown in FIG. 3 or full-bridge, as the other input circuits. Similarly, all of the output circuits 100 may employ the same topology, e.g. full-bridge output circuit 100 (FIG. 3) or half-bridge output circuit 150 (FIG. 4), as the other output circuits. In operation, the input cells 50A, 50B each drive the transformer 81 in a power-sharing array of cells. Similarly, the output cells 100A, 100B, 100C, 100D form a power-sharing array in supplying power to the output. Because the input and output cells are fault-tolerant, the converter 90 may continue to operate, albeit at a reduced power throughput capacity, after a fault. For example, in the event one of the input cells fails, e.g. 50A, the converter 90 may continue to operate processing power through input cell 50B. Similarly, if one or more of the output cells fail, e.g. 100A, 100B, the power converter 90 may continue to operate, processing power through output cells 100C, and 100D. The power converter 90 of FIG. 5 therefore provides a more granular fault-tolerant power-sharing solution than might be possible with individual power converters. For the multi-cell converter of FIG. 5, it is preferable to use switches that are capable of blocking current in both directions as discussed above in connection with FIG. 3. A fault detection circuit such as detection circuit 84 (FIG. 6) may be used with the multi-cell converter 90 shutting down individual cells or all cells depending on the nature of the fault.

III. Common Source Synchronous Rectifier

Figure 7:
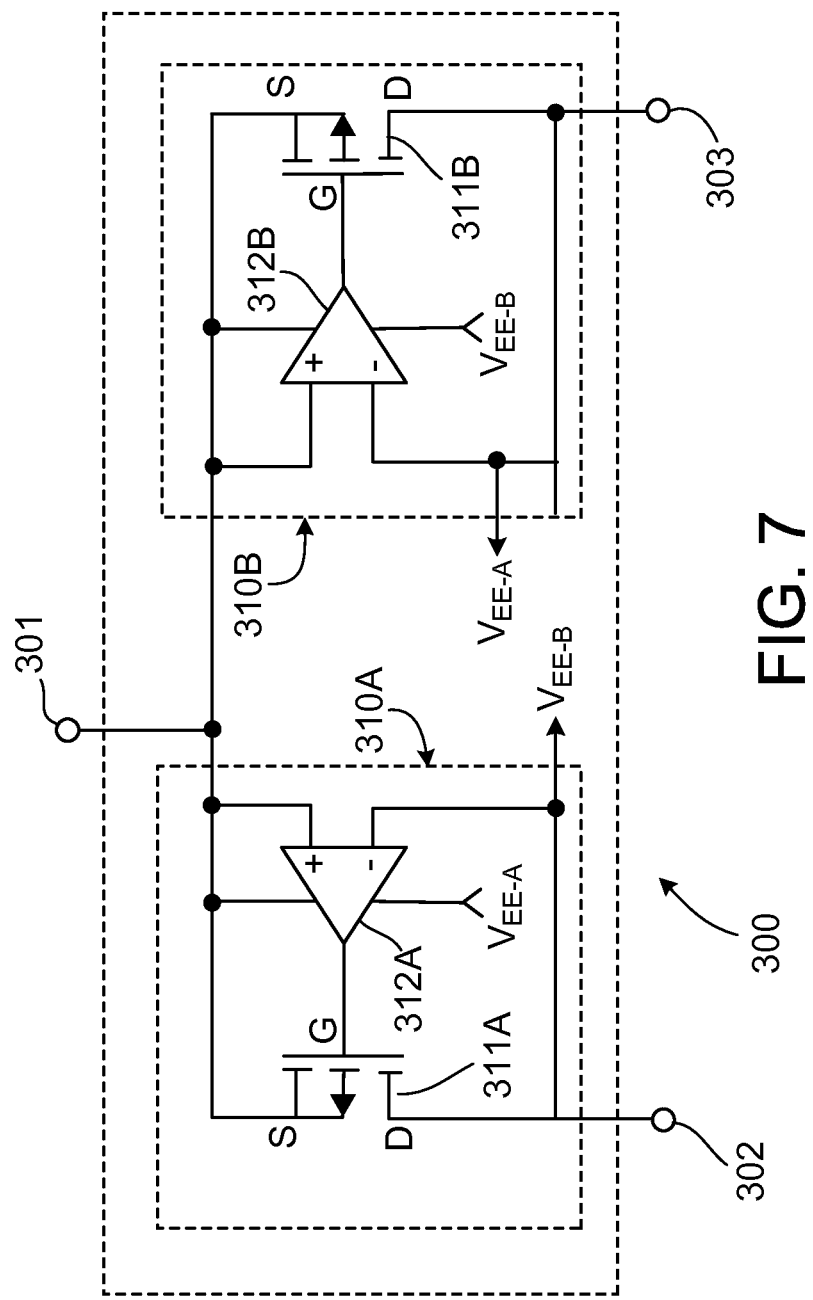
FIG. 7 shows an improved dual p-channel MOSFET device.
Figure 8:
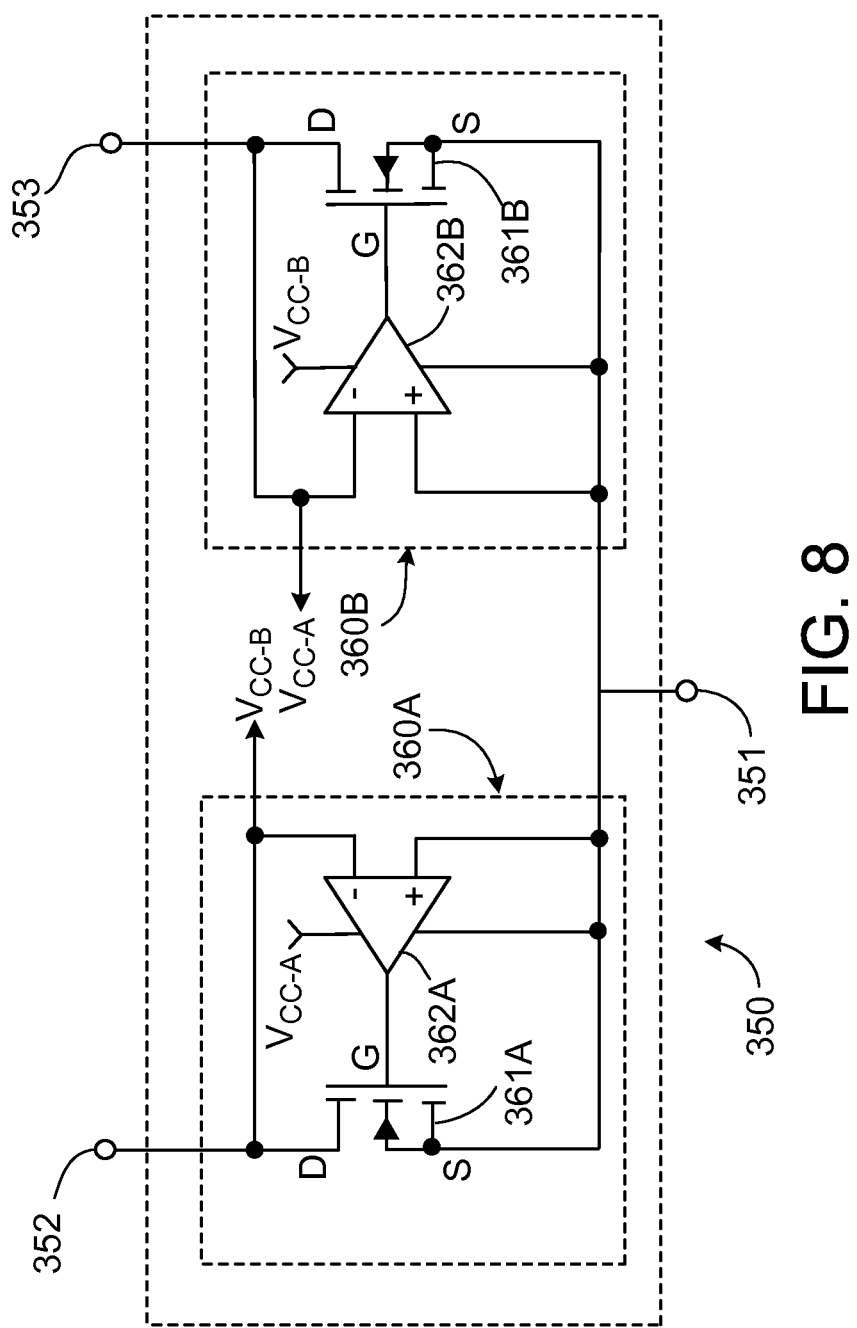
FIG. 8 shows an improved dual n-channel MOSFET device.

Referring to FIGS. 7 and 8, common-source dual synchronous rectifier devices particularly adapted for use in synchronous rectification applications including the fault-tolerant full-bridge output circuit 100 (FIG. 3) and in standard center-tapped output circuits are shown. A common-source dual p-channel enhancement mode MOSFET device 300 is shown in FIG. 7. As shown, the device includes two p-channel MOSFET switches 311A, 311B having their respective source terminals connected to a common terminal 301. The drains of switches 311A, 311B are connected to terminals 302, 303 respectively. Each switch 311A, 311B is turned ON and OFF by a respective control circuit 312A, 312B which has an output connected to the gate terminal of the switch. Each control circuit 312A, 312B, which may include an amplifier as shown, has inputs for sensing the source-to-drain voltage of its respective switch 311A, 311B. The offset and gain of the control circuit may be set to ensure that its switch turned ON when the drain of its switch is more positive than the source by a predetermined threshold, such as 5 mV, and fully ON when the drain of its switch is more positive than the source by a predetermined positive level, such as 10 mV.

The p-channel common-source dual synchronous-rectifier 300 may be self-powered, e.g. for use in a three terminal package as shown in FIG. 7, by connecting the negative power supply rail of control circuit 312A to the drain terminal 303 of the complementary device 311B. Similarly, the negative power supply rail of control circuit 312B may be connected to the drain terminal 302 of its complementary device 311A. In operation, only one switch 311A, 311B may be turned ON at a time because the power to turn each switch ON is derived from a reverse bias across the other switch. The three-terminal dual synchronous-rectifier 300 is particularly well adapted for use in the output circuit 100 of FIG. 3. For example, switched rectifiers 110 and 130 may be replaced with a single common source device 300. The device 300 may also be used in a center-tap output circuit 30A (FIG. 2A) in place of MOSFETs 31A, 32A.

A common-source dual n-channel enhancement mode MOSFET device 350 is shown in FIG. 8. As shown, the device includes two n-channel MOSFET switches 361A, 361B having their respective source terminals connected to a common terminal 351. The drains of switches 361A, 361B are connected to terminals 352, 353 respectively. Each switch 361A, 316B is turned ON and OFF by a respective control circuit 362A, 362B which has an output connected to the gate terminal of the switch. Each control circuit 362A, 362B, which may include an amplifier as shown, has inputs for sensing the source-to-drain voltage of its respective switch 361A, 361B. The offset and gain of the control circuit may be set to ensure that its switch is turned ON when the drain of its switch is more negative than the source by a predetermined threshold, such as −5 mV, and fully ON when the drain of its switch is more negative than the source by a predetermined negative level, such as −10 mV.

The n-channel common-source dual synchronous-rectifier 350 also may be self-powered, e.g. for use in a three terminal package as shown in FIG. 8, by connecting the positive power supply rail of control circuit 362A to the drain terminal 353 of the complementary device 361B. Similarly, the positive power supply rail of control circuit 362B may be connected to the drain terminal 352 of its complementary device 361A. In operation, only one switch 361A, 361B may be turned ON at a time because the power to turn each switch ON is derived from a reverse bias across the other switch. The three-terminal dual synchronous-rectifier 350 is particularly well adapted for use in the output circuit 100 of FIG. 3. For example, switched rectifiers 120 and 140 may be replaced with a single common source device 350. The device 350 may also be used in a center-tap output circuit 30B (FIG. 2B) in place of MOSFETs 31B, 32B.

The dual common-source synchronous rectifiers of FIGS. 7 and 8 may be deployed in the output circuit 100 of FIG. 3 to provide an additional benefit in which a switch adjacent (e.g. switches 110 and 130 are adjacent each other, switches 120 and 140 are adjacent each other) a shorted switch is prevented from turning ON because its power is derived from the reverse bias of the adjacent switch. The dual common-source synchronous rectifiers may also be used in the output circuits of FIGS. 11 and 14 as discussed below.

The dual common-source synchronous-rectifier devices shown in FIGS. 7 and 8 may use the common-source MOSFET device described below in connection with FIG. 10 to reduce the interconnection resistance and thus reduce the ON resistance and further reduce the power losses in the rectifiers. The dual common-source interdigitated MOSFETs and the control circuits of FIGS. 7 and 8 may be integrated onto a single die. Alternatively, one or two separate MOSFET die and a controller die may be mounted to a substrate, such as a printed circuit board providing interconnections between the die and terminals for connection to an external circuit (e.g. output circuit 100), and over molded into a system in a package ("SIP"). The SIP may have three terminals as shown in FIGS. 7 and 8, or may include additional terminals for providing external power to the control circuits, or a disable input for disabling the switches.

IV. Common-Source FETs

Figure 9:
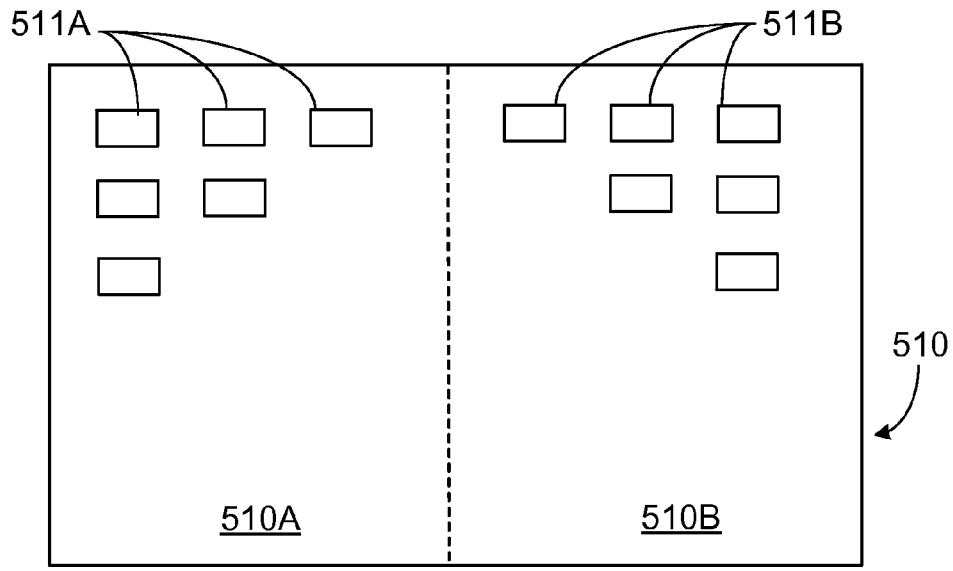
FIG. 9 shows the die of a prior art semiconductor device.

Referring to FIG. 9, a die 510 of a prior art dual MOSFET device is shown having two macro MOSFET devices 510A and 510B each comprising a multiplicity of individual elements 511A, 511B respectively. As shown, the die is conceptually and logistically divided in two by a dashed line with the individual elements 511A, 511B making up each MOSFET 510A, 510B segregated.

Figure 10:
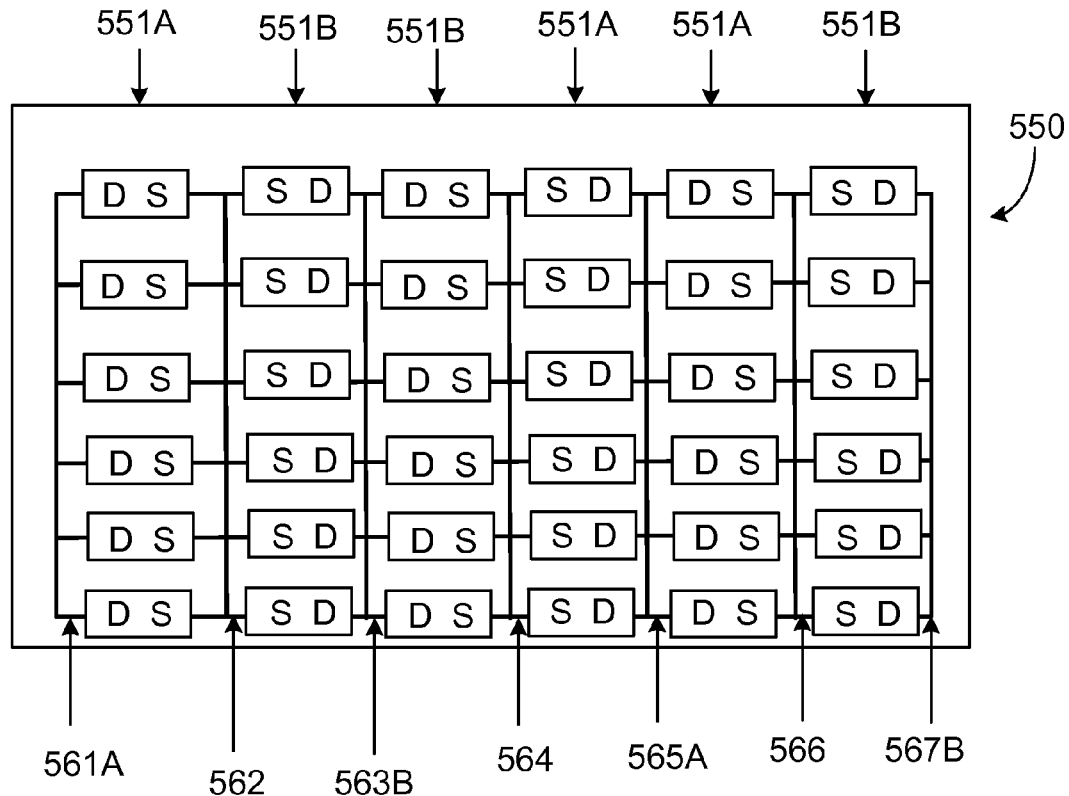
FIG. 10 shows the die of an interdigitated common-source dual MOSFET semiconductor device.

Referring to FIG. 10, an improved dual common-source MOSFET device 550 is shown including a multiplicity of individual elements 551A, 551B arranged in columns. The pattern illustrated includes three columns of elements for each device: starting from left to right with a single column of 551A elements, a pair of columns of 551B elements, a pair of columns of 551A elements, and ending with a single column of 551B elements. The elements in the columns labeled 551A make up macro device 551A and the elements in the columns labeled 551B make up macro device 551B. The source and drain terminals of each individual element is labeled with an S and D. As shown, the source and drain terminals of individual elements within a column may be arranged to match those of the adjacent column of elements. In other words, all of the drains are available on one side and all the sources are available on the other side of a column of elements. This arrangement of elements with alternating columns of drains and sources is advantageous for making interconnections.

Referring to FIG. 10, interconnections 561-567 are shown schematically with simple straight lines in the same plane as the individual elements. It should be understood, however, that the interconnections between individual elements, groups of elements, and external terminations such as a ball grid array are typically made in layers above the individual elements for example as described in Briere, Flip Chip FET Device, U.S. Pat. No. 6,969,909 issued Nov. 29, 2005 (the entire contents of which are incorporated here by reference). As shown in FIG. 10, the odd numbered interconnections 561, 563, 565, 567 are used for the drain connections and include a suffix, A or B, indicating to which MOSFET device they belong: the drains of the elements forming device 551A are connected to interconnect 561A and 565A and the drains of the elements forming device 551B are connected to interconnect 563B and 567B. The even numbered interconnections 562, 564, 566 are used for the source connections. As shown in FIG. 10, the source connections 562, 564, 566 are shared by both MOSFET devices 551A, 551B, i.e. the sources of the elements in columns 551A and 551B are connected together by interconnections 562, 564, 566.

The alternating pattern of interleaved elements, e.g. the alternating columns of elements in FIG. 10, may be said to be "interdigitated." Using interdigitation in a multi-component device, such as the two MOSFET device in FIG. 10, allows for improved interconnection schemes. For example, only one source interconnection is required for the dual MOSFET device of FIG. 10 allowing for larger conductors to be used, only three high current conductors (Drain A, Drain B, and the common source) rather than the customary four (Drain A, Source A, Drain B, Source B) are required for making connections to the die 550. Although alternating pairs of columns of individual elements are shown, other alternating patterns, e.g. alternating rows, may be used depending upon the interconnection scheme to achieve the benefits of interdigitated MOSFET elements on the die. Additionally, alternating patterns of groups of individual elements may also be interdigitated to form for example checkerboard patterns.

As described above, the interdigitated common-source dual-MOSFET devices may be used together with the type of control circuit shown in FIGS. 7 and 8 in a three or four terminal device. Alternatively, the interdigitated common-source dual-MOSFET devices may be provided as five terminal devices (Drain A, Drain B, Gate A, Gate B, Source) for use in applications which use external control circuitry such as in the input circuits 250, 420 shown in FIGS. 11 and 14 respectively.

V. Regulating Efficiency and Output Resistance in DC Transformers and SACs

Figure 13:
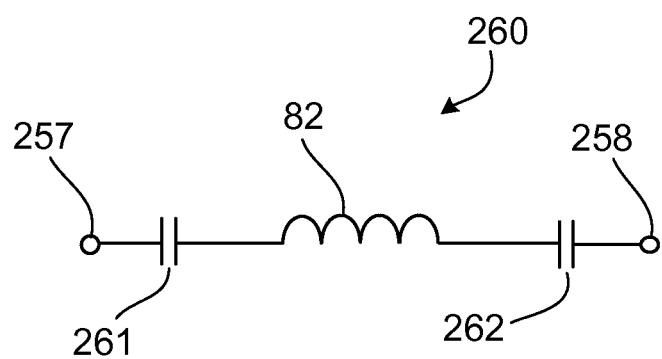
FIG. 13 shows a resonant primary circuit for modifying the converter of FIG. 11 to a SAC based topology.

Referring to FIG. 11, another improved fault-tolerant power converter 200 is shown. The primary side of converter 200 includes a full-bridge input circuit 250 connected to primary winding 82 of transformer 81. As shown, four primary switches S1 251, S2 252, S3 253, and S4 254 are connected to form a full-bridge driver circuit. Switches 251, 252 and 253, 254 are connected in respective series circuit legs across the input, 211, 212. The primary winding is connected across the two legs, with one end of the winding connected to node 257 (the junction of switches 251, 252) and the other end of the winding connected to node 258 (the junction of switches 253, 254). Converter 200 may be based upon the Sine Amplitude Converter topology described in the SAC Patent and the POL SAC Patent, in which case a resonant capacitor may be inserted in series with one or both ends of primary winding 82, i.e. between the winding and nodes 257 and/or 258 for example as shown in FIG. 13.

The secondary side of converter 200 is shown including a full-bridge output circuit 270 connected to the secondary winding 83 of transformer 81. As shown, four secondary switches R1 271, R2 272, R3 273, and R4 274 are connected in a full-bridge rectification circuit. Switches 271, 272 and 273, 274 are connected in respective series circuit legs across the output 213, 214. The secondary winding is connected across the two legs, with one end of the winding connected to node 277 (the junction of switches 271, 272) and the other end of the winding connected to node 278 (the junction of switches 273, 274).

A. Operating Cycle Phases

Figure 12:
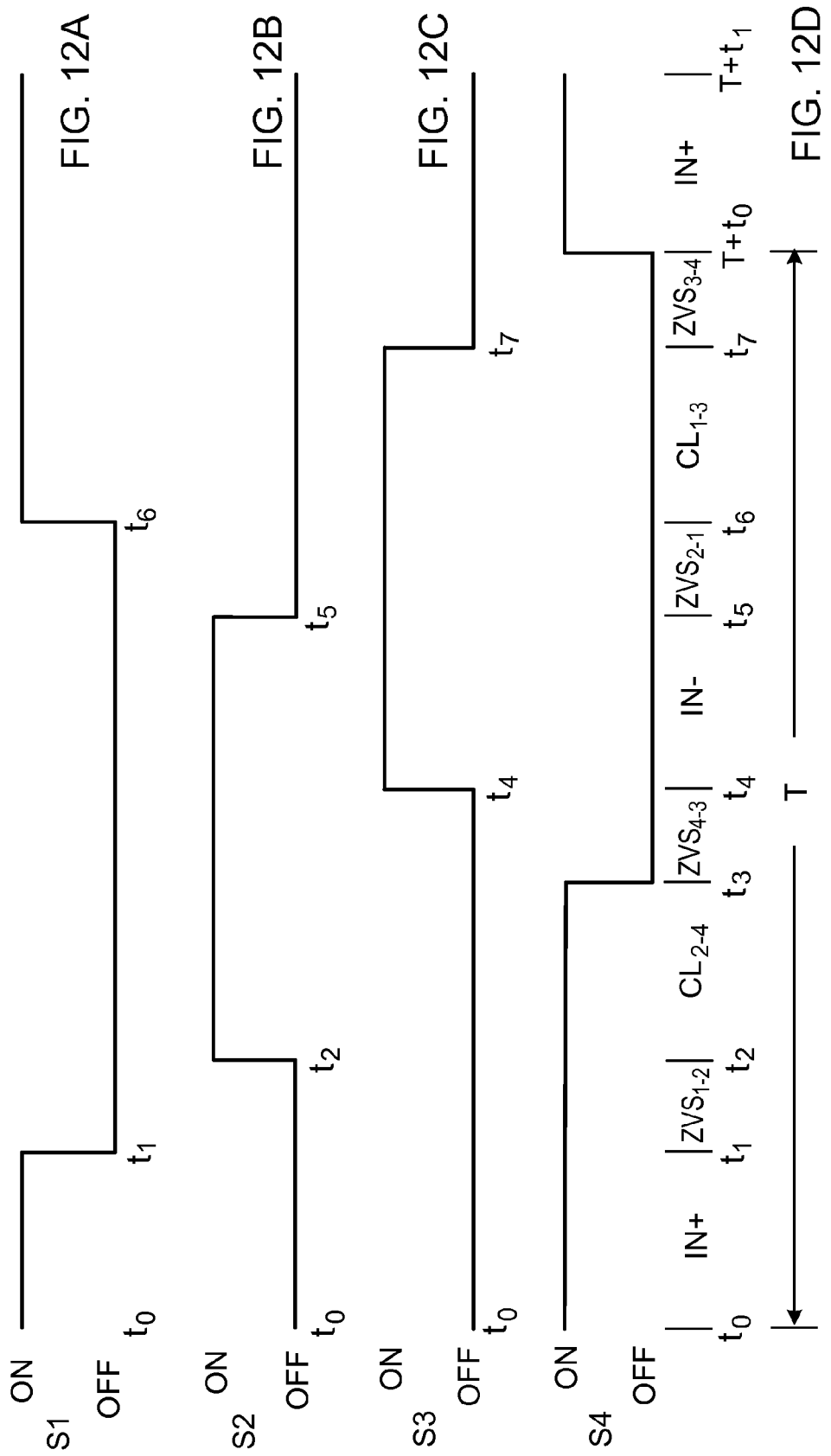
FIGS. 12A-12D show timing waveforms for operating the switches in the converter of FIG. 11.

Referring to FIG. 12, converter 200 may be operated in a series of converter operating cycles having an operating period T. Beginning with a first power transfer phase ("IN+"), from time t0 to t1 in FIG. 12, switches S1 and S4 are ON, connecting primary winding 82 across the input source allowing the primary current to ramp up for a first half-cycle. The magnetizing energy in the transformer also increases in magnitude during the power transfer phase.

An energy-recycling interval ($ZVS_{1-2}$) is initiated at time t1, when switch S1 is turned OFF (switch S4 remains ON) and the magnetizing current flowing in the transformer primary is allowed to charge and discharge the capacitances associated with node 257. The capacitances at node 257 may include the parasitic capacitances associated with switches S1, S2 and added capacitance. At the end of the $ZVS_{1-2}$ energy-recycling interval, when the voltage at node 257 reaches zero (or a minimum if there is insufficient magnetizing current to fully charge and discharge the capacitances at node 257), switch S2 may be turned ON at time t2 with essentially zero voltage across it. An energy recycling interval may be defined as a time interval during which energy stored in the transformer or other inductive components is used to charge or discharge capacitances across one or more switches to reduce the voltage across the switch in preparation for turning the switch ON.

During the interval from time t2 to time t3, switches S2 and S4 are both ON clamping the primary winding 82 (the "$CL_{2-4}$" phase). The windings and switches may be chosen to have minimal resistance which minimizes the resistance in the clamp circuit path that includes the primary winding 82, switch S2 and switch S4. As a result, the primary winding may be clamped for relatively long times without any appreciable decay in the magnetizing current which may be used for the next ZVS transition. The clamp phases may be used to control the effective output resistance of the converter or to reduce power dissipation during light loads as discussed further below. A clamp phase may be defined as a time interval during which: (i) one or more windings of the transformer is shunted, (ii) there is essentially zero voltage across the clamped winding or windings, (iii) energy is retained in the transformer, and (iv) essentially no current flows between the secondary winding and the output of the converter.

Another energy-recycling interval ("$ZVS_{4-3}$") may be initiated at time t3 when switch S4 is turned OFF and the magnetizing current which is still flowing in the primary winding begins to charge and discharge the capacitances associated with node 258. The capacitances at node 258 may include the parasitic capacitances associated with switches S3, S4 and any added capacitance. At the end of the $ZVS_{4-3}$ energy-recycling interval, when the voltage at node 258 reaches Vin (or a maximum if there is insufficient magnetizing current to fully charge and discharge the capacitances at node 258 to Vin), switch S3 may be turned ON at time t4 with essentially zero voltage across it.

A second power transfer phase (IN−) occurs from time t4 to t5, during which switches S2 and S3 are ON, the primary winding 82 is connected across the input source and the primary current is allowed to ramp up. In the IN− phase, the primary winding 82 is connected in reverse and the primary current flows in the opposite direction than during the IN+ phase.

An energy-recycling interval, $ZVS_{2-1}$, may be initiated at time t5 when switch S2 is turned OFF (switch S3 remains ON) and the magnetizing current flowing in the transformer primary is allowed to charge and discharge the capacitances associated with node 257. When the voltage at node 257 reaches Vin (or a maximum if there is insufficient magnetizing current to fully charge and discharge the capacitances at node 257), switch S1 may be turned ON at time t6 with essentially zero voltage across it.

Another clamp phase "$CL_{1-3}$" may be entered from time t6 to time t7 with switches S1 and S3 both ON and clamping the primary winding 82. Like the circuit path for the $CL_{2-4}$ phase, the resistance of the circuit for the $CL_{1-3}$ phase may be minimized by appropriate selection of switches S1 and S3 allowing the primary winding to be clamped in the $CL_{1-3}$ phase for relatively long times without any appreciable decay in the magnetizing current. Note that a second clamp phase is optional, therefore either of the $CL_{1-3}$ or $CL_{2-4}$ phases may be omitted extending the remaining clamp phase accordingly.

A final energy-recycling interval, $ZVS_{3-4}$, may be initiated at time t7 when switch S3 is turned OFF and the magnetizing current which is still flowing in the primary winding begins to charge and discharge the capacitances associated with node 258. At the end of the $ZVS_{3-4}$ transition, when the voltage at node 258 reaches zero (or a minimum if there is insufficient magnetizing current to fully charge and discharge the capacitances at node 258 to zero), switch S4 may be turned ON with essentially zero voltage across it at time T+t0 beginning another converter operating cycle.

Although FIGS. 12A-12D are labeled S1-S4 corresponding to the primary switches 251-254 in FIG. 11, the same timing may be applied to the secondary switches 271-274 respectively: switches S1 and R1, S2 and R2, S3 and R3, and S4 and R4 may be operated as shown in FIGS. 12A, 12B, 12C, and 12D respectively. For example, a switch controller 201 (FIG. 11) may control the primary and secondary switches. Control signals 202 may be connected to the primary switches 251-254 and their respective counterparts 271-274 (using the appropriate level shifters, pulse transformers, etc.) to drive each primary-secondary switch pair (e.g. switch pairs S1-R1, S2-R2, S3-R3, S4-R4) together. In this way, both primary and secondary windings would be clamped during each of the $CL_{2-4}$ and $CL_{1-3}$ phases preventing unwanted ringing due to the transformer leakage inductance. Clamping both windings of the transformer may increase the efficiency of the clamp because the primary and secondary clamp circuits are effectively connected in parallel which further reduces the resistance of the clamp circuit. In other words the clamp circuit becomes more ideal: the current passes through a lower resistance reducing dissipation and the voltage across each clamped winding is reduced further towards zero.

B. SAC Topology Considerations

The converter 200 of FIG. 11 may be configured using the Sine Amplitude Converter ("SAC") topology described in the SAC Patent. The SAC topology typically includes a primary-side series resonant circuit. Referring to FIG. 13, a primary-side series resonant circuit 260 adapted for use with full bridge input circuit 250 of FIG. 11 is shown having a resonant capacitor 261, (and a second, optional, resonant capacitor for symmetry) 262 connected to each end of the primary winding 82. The resonant capacitors 261, 262 and the primary-reflected leakage inductance of the transformer form the series resonant circuit 260 defining the characteristic resonant frequency and period (the "operational resonant frequency" and "operational resonant period") of the SAC. The ends, 257 and 258, of the series-resonant primary circuit 260 connect to the similarly labeled nodes of input circuit 250 in place of the transformer primary winding 82 shown in FIG. 11. Referring to FIG. 12, the duration of the IN+ and IN− phases for the SAC topology will be determined by the operational resonant frequency. As more fully explained in the SAC patent, the current in the primary winding is the sum of two components: a resonant current and the magnetizing current. Each of the IN+ and IN− phases are approximately equal in duration to a half cycle of the resonant current and therefore will be approximately equal to one half of the operational resonant period.

As described above, the clamp phases are intended to clamp the transformer, typically by shunting one or more windings of the transformer, storing energy in the transformer for later use, e.g. to charge and discharge capacitances facilitating a ZVS transition. Closing the primary switches (S2-S4 or S1-S3) during a clamp phase in the SAC topology, however, shunts the resonant circuit 260, rather than the primary winding 82, allowing the magnetizing current to interact with the resonant capacitors, i.e. forming a resonant circuit between the magnetizing inductance of the transformer and the resonant capacitors 261, 262. The magnetizing inductance, typically being much larger than the leakage inductance, resonates with the resonant capacitors 261, 262 at a frequency (the "clamp resonant frequency") much lower than the operating resonant frequency of the SAC. Although the oscillations during a clamp phase will occur over a much longer time scale, the magnetizing current will resonantly charge and discharge the resonant capacitors placing limits on the duration of the clamp phases using the primary switches in the SAC topology. It may be preferable therefore to clamp the secondary winding in the SAC topology rather than the primary resonant circuit.

C. Control Strategies

The power losses in a power converter include load dependent power dissipation and fixed losses due to operating the converter. Load dependent losses may include for example the power lost in the ON resistance of the switches and winding resistance which are a function of load. Fixed power losses may include power lost in turning the switches ON and OFF, i.e. charging and discharging the gate capacitances of MOSFET switches and core losses both of which may be a function of converter operating frequency. Typically power converters are optimized for operation at or near full load which may fix the gate drive levels and operating frequency. At light loads, however, the fixed losses can become significant impairing converter operating efficiency.

1. Efficiency Regulation

One way to control the converter 200 of FIG. 11 and the SAC-based modification (described above in connection with FIG. 13), is to improve converter efficiency at light loads. Inserting one or more clamp phases (FIG. 12) in the operating cycle, in effect reduces the average number of converter operating cycles available to power the load which increases the average power the converter must process during each converter operating cycle. As the duration of the clamp phases is increased, the power processed by the converter during each operating cycle increases. In addition to allowing the converter to operate in a more efficient power range, the clamp phases help spread the fixed losses associated with each converter operating cycle over longer periods reducing the average fixed power losses at light loads while still allowing the power conversion to happen at the frequency set for peak efficiency. Although the load dependent losses may increase as the converter is forced to process more power during each converter operating cycle, the net result is more efficient converter operation at lower power levels.

For example, the SAC version of the converter of FIG. 11 designed to deliver a nominal output voltage of 1V over a current range of 0-180 A optimized for loads greater than 30 A may have fixed losses of about 1.8 W. For loads from 30 to 180 Amps, the converter may operate at or above 93% efficiency, perhaps peaking at 95% efficiency at about 75 A. However, as the load decreases, the efficiency falls dramatically 85% at 10 A, 74% at 5 A, etc. By using variable duration clamp phases, increasing the duration as the load decreases, the same converter power train may achieve the same 93% or higher efficiency down to very light loads (e.g. 5 Amps or lower) with little or no penalty at higher loads. Assuming the characteristic period of the resonant circuit is 570 nS, each IN+ and IN− phase will be approximately 285 nS long. Further assuming minimum ZVS transitions of 5.7 nS each, with no clamp phases, the converter may be operated at 98% duty cycle peak. As the load decreases the clamp phases may be added and increased in duration e.g. up to 20 times the characteristic period each, reducing the effective duty cycle of the converter to 5%. At 5% duty cycle the fixed losses may be reduced almost by a factor of 20 dramatically improving the low load performance of the converter.

2. Output Resistance Regulation

DC-to-DC voltage transformers, e.g. SACs, the converter 200 of FIG. 11, and the SAC based modification of converter 200 may be used to convert power from a Factorized Bus at a controlled voltage for delivery to a load, e.g. as described in the FPA and Micro FPA patents. The output voltage of the DC-to-DC voltage transformer may droop slightly as a function of load current due to the output resistance of the particular converter. Methods for compensating for the droop include using a feedback loop from the load to the power regulator supplying the Factorized Bus. It may be desirable in some applications to control the output resistance of the converter. The clamp phases may be used to control the effective output resistance of the converter of FIG. 11 (and the SAC based converter described above) is a function of the effective duty cycle. At the converters maximum duty cycle (e.g. 98% for the example above), the output resistance is minimized. As the clamp phases are added and the total clamp phase duration is increased, the output resistance will also increase. Using the example above, as the load decreases from 180 Amps to 10 Amps, the total clamp duration may be increased from 0 to 11.4 microseconds (corresponding to a decrease in duty cycle from 98% down to 5%), increasing the output resistance of the converter from less than 0.4 milliohms to more than 6 milliohms. By increasing the output resistance as the load decreases and vice versa, the output droop can be minimized in effect minimizing the effective output resistance of the converter.

The controller 201 in FIG. 11 may be used to control the clamp phase duration as a function of load current to maximize efficiency over the operating range, to minimize the effective output resistance over the load range, or even to provide micro-regulation using variations in the output resistance at a particular operating point depending on the control algorithm and feedback loops. For example the clamp phase duration may be maximized for each load to reduce fixed converter losses, or may be controlled as a function of load to provide a linear decrease in output resistance with increasing load, or may be varied as a function of the difference between the output voltage and a reference voltage to control the output voltage independently of load current.

The converter 200 of FIG. 11 and the SAC-based modification of converter 200 may be operated in the fault tolerant mode discussed above. Controller 201 may monitor nodes 257 and 258 for the primary-side voltage transitions, e.g. during the $ZVS_{1-2}$, $ZVS_{4-3}$, $ZVS_{2-1}$, and $ZVS_{3-4}$ phases, and nodes 277, 278 for secondary-side transitions to ensure that one switch opens before the next switch is closed. In the event of a switch failure all switches may be disabled to prevent a short across the input or output. Thus the input circuit 250 and output circuit 270 also provide fault tolerance as discussed above in connection with FIGS. 3-6. The input circuit 250 and output circuit 270 are full bridge circuits in which the interdigitated common-source MOSFET devices described above in connection with FIG. 10 may advantageously be used. The controller 201 in FIG. 11 operates the primary, and optionally the secondary switches, obviating the need for internal control circuits 312A, 312B (FIG. 7) and 362A, 362B (FIG. 8) in the input circuit 250 and output circuit 270 if operated by controller 201. Therefore the three-terminal common-source synchronous rectifiers of FIGS. 7 and 8 may not be necessary in the converter of FIG. 11, but may be used in the output circuitry if desired.

VI. POL SAC with Remote Driver

Referring to FIG. 14, a fault-tolerant converter 400 similar to the converter 200 of FIG. 11 modified with the series resonant circuit 260 of FIG. 13 is shown. The converter 400 includes a fault tolerant driver 420 connected to drive one or more point-of-load ("POL") circuits 430 connected to the driver 420 via an AC bus 410. The driver 420 may comprise a full-bridge fault-tolerant input circuit such as input circuit 250 of FIG. 11 and a switch controller 425 similar to the switch controller described above in connection with FIG. 11. The POL circuit 430 may include a transformer circuit 440 and an output circuit 450. The transformer circuit 440 may include resonant capacitors 441, 442 connected to the primary winding 82 of transformer 81. Although shown connected to the primary winding, the resonant capacitors may instead be connected to the secondary winding. Similarly, a single resonant capacitor may be used instead of the two resonant capacitors shown in the symmetrical balanced circuit of FIG. 14. The secondary winding may be connected to a full-bridge fault-tolerant rectification circuit 450 as shown in FIG. 14. The full-bridge fault-tolerant rectification circuit 450 may use switches, R1, R2, R3, R4, operated as rectifiers in the manner described above in connection with the output circuit 100 of FIG. 3 and may preferably employ the common-source synchronous rectifiers described in connection with FIGS. 7 and 8. Note that a simplified symbol is used in FIG. 14 for switches S1-S4 and R1-R4 (instead of the enhancement mode MOSFET symbols used, e.g. in FIGS. 2-4, 7, 8, 11) in which the arrow indicates the direction of current flow through the intrinsic body drain diode when the switch is open.

In contemporary electronic systems, space is at a premium on customer circuit boards, e.g. on a circuit board near a processor. Additionally, thermal management considerations place limits on the efficiency and power dissipation of power supplies at or near the point of load. As its name implies, the POL circuit 430 (FIG. 14) is designed to be deployed at the point of load, where space and thermal requirements are stringent. However, because the driver circuit 420 is not necessary at the point of load, it may be deployed elsewhere, away from the point of load, reducing the space required by the POL circuitry and reducing the power dissipation at the point of load. Because the driver circuitry is removed from the POL, a slightly larger transformer structure and output switches (R1-R4) may be used improving overall converter efficiency and reducing dissipation at the POL. Similarly, larger input switches (S1-S4) may be used in the driver circuit to further improve overall efficiency without impacting space considerations at the POL.

However counter intuitive separating the driver 420 from the POL circuitry 430 and deploying an AC bus may initially seem, closer inspection refutes such objections. For example, power carried by the AC bus 410 is spectrally pure (sine wave) and has voltage and current slew rates less than those typically found in the signal paths of computer circuitry reducing concerns about noise and emissions.

Although the driver circuit 420 is shown in FIG. 14 connected to only one POL circuit 430, it may in fact drive a plurality of POL circuits. The POL circuit 430 may be enclosed as a single module, i.e. packaged for deployment as a single self-contained unit, or as a pair of modules for deployment as component pairs, e.g. 440 and 450. Because switches R1-R4, need only withstand the output voltage, the output circuit 450 may be integrated (with or without the control circuitry, e.g. as shown in FIGS. 7 and 8) onto a die with circuitry to which it supplies power, e.g. a processor core.

A number of embodiments of the invention have been described. Nevertheless, it will be understood that various modifications may be made without departing from the spirit and scope of the invention. For example, the switch rectifiers may be operated by a common controller, or the synchronous rectifier function and fault tolerant functions may be combined into a single controller. A single clamp phase (e.g. $CL_{2-4}$) may used rather than the dual clamp phase ($CL_{2-4}$, $CL_{1-3}$) operating cycle shown in FIG. 12. As described above, the secondary switches may be used to clamp the secondary winding during the clamp phase in addition to or instead of clamping the primary winding. A SAC topology including a half-bridge input circuit and a full-bridge output circuit may be used with the output switches providing the clamp function. The switch controller may recycle the energy from the gate capacitances for example as described in Vinciarelli, Low-Loss Transformer-Coupled Gate Driver, U.S. Pat. No.

6,911,848, issued on Jun. 28, 2005 (assigned to VLT, inc. of Sunnyvale, Calif., the entire disclosure of which is incorporated herein by reference).

Accordingly, other embodiments are within the scope of the following claims.

What is claimed is:

1. A method of converting power via a transformer for supplying a low voltage output comprising:
   providing a secondary winding having a first terminal and a second terminal;
   providing a first switch and a second switch each adapted to block current flow in an OFF state in at least one direction;
   forming a first series circuit with the first switch connected to the second switch at a first junction, the first series circuit having two end terminals;
   connecting the first terminal of the secondary winding to the first junction;
   connecting the first series circuit across an output with each of the two end terminals connected to a respective terminal of the output and with each of the first and second switches being arranged in the OFF state to block current flow through the first series circuit in a direction that would short the output, wherein a short across one of the first or second switches does not short the output;
   sensing an output of the second switch and preventing the first switch from turning ON if the sensing indicates that the second switch is not open; and
   sensing an output of the first switch and preventing the second switch from turning ON if the sensing indicates that the first switch is not open.

2. The method of claim 1 further comprising:
   sensing across each of the first and second switches, a respective voltage polarity; and
   turning each of the first and second switches ON when the sensed voltage polarity across the respective switch comprises a first polarity and OFF when the sensed voltage polarity across the respective switch comprises a second polarity, wherein the second polarity is opposite of the first polarity.

3. The method of claim 1 further comprising:
   providing a third switch and a fourth switch each adapted to block current in an OFF state in at least one direction;
   forming a second series circuit with the third switch connected to the fourth switch at a second junction, the second series circuit having two end terminals;
   connecting the second terminal of the secondary winding to the second junction; and
   connecting the second series circuit across the output with each of the two end terminals connected to a respective terminal of the output and with each of the third and fourth switches being arranged in the OFF state to block current flow through the second series circuit in a direction that would short the output, wherein a short across one of the third or fourth switches does not short the output.

4. The method of claim 3 further comprising:
   preventing the third switch from turning ON if the fourth switch fails to open;
   preventing the fourth switch from turning ON if the third switch fails to open.

5. The method of claim 4 further comprising:
   sensing across each of the third and fourth switches, a respective voltage polarity; and
   turning each of the third and fourth switches ON when the sensed voltage polarity across the respective switch comprises a first polarity and OFF when the sensed voltage polarity across the respective switch comprises a second polarity, wherein the second polarity is opposite of the first polarity.

6. The method of claim 5 further comprising:
   providing a first control circuit to operate the first switch;
   providing power to operate the first control circuit and first switch from across the third switch;
   providing a third control circuit to operate the third switch; and
   providing power to operate the third control circuit and third switch from across the first switch.

7. The method of claim 6 further comprising:
   providing a second control circuit to operate the second switch;
   providing power to operate the second control circuit and second switch from across the fourth switch;
   providing a fourth control circuit to operate the fourth switch; and
   providing power to operate the fourth control circuit and fourth switch from across the second switch.

8. The method of claim 7 further comprising:
   providing a first common-source dual MOSFET semiconductor device including a first MOSFET and a third MOSFET integrated on a first semiconductor die;
   providing a common source terminal for connecting to the first and third MOSFETs in the first common-source dual MOSFET semiconductor device;
   using the first MOSFET and the third MOSFET of the first common-source dual MOSFET semiconductor device for the first and third switches;
   providing a second common-source dual MOSFET semiconductor device including a second MOSFET and a fourth MOSFET integrated on a second semiconductor die;
   providing a common source terminal for connecting to the second and fourth MOSFETs in the second common-source dual MOSFET semiconductor device;
   using the second MOSFET and the fourth MOSFET of the second common-source dual MOSFET semiconductor device for the second and fourth switches.

9. The method of claim 8 further comprising:
   integrating the first and third control circuits in the first common-source dual MOSFET semiconductor device; and
   integrating the second and fourth control circuits in the second common-source dual MOSFET semiconductor device.

10. The method of claim 9 further comprising:
    providing a plurality of individual first and third MOSFET elements on the first semiconductor die;
    arranging the individual first and third MOSFET elements in an alternating pattern on the first semiconductor die;
    connecting the first MOSFET elements together to form the first MOSFET;
    connecting the third MOSFET elements together to form the third MOSFET;
    using a common source metallization to interconnect the source terminals of the first and third MOSFET elements;
    providing a plurality of individual second and fourth MOSFET elements on the second semiconductor die;
    arranging the individual second and fourth MOSFET elements in an alternating pattern on the second semiconductor die;
    connecting the second MOSFET elements together to form the second MOSFET;

connecting the fourth MOSFET elements together to form the fourth MOSFET; and using a common source metallization to interconnect the source terminals of the second and fourth MOSFET elements.

11. The method of claim 10 wherein the first and second common-source dual MOSFET semiconductor devices each have exactly three terminals.

12. The method of claim 6 further comprising:
providing a common-source dual MOSFET semiconductor device including a first MOSFET and a third MOSFET integrated on a semiconductor die;
providing a common source terminal for connecting to the first and third MOSFETs in the common-source dual MOSFET semiconductor device; and
using the first MOSFET and the third MOSFET of the common-source dual MOSFET semiconductor device for the first and third switches.

13. The method of claim 12 further comprising integrating the first and third control circuits in the common-source dual MOSFET semiconductor device.

14. The method of claim 13 further comprising:
providing a plurality of individual first and third MOSFET elements on the semiconductor die;
arranging the individual first and third MOSFET elements in an alternating pattern on the semiconductor die;
connecting the first MOSFET elements together to form the first MOSFET;
connecting the third MOSFET elements together to form the third MOSFET; and
using a common source metallization to interconnect the source terminals of the first and third MOSFET elements.

15. The method of claim 14 wherein the common-source dual MOSFET semiconductor device has exactly three terminals.

16. The method of claim 1 further comprising:
forming a second series circuit with a first capacitor connected to a second capacitor at a second junction, the second series circuit having two end terminals;
connecting the second terminal of the secondary winding to the second junction; and
connecting the second series circuit across the output with each of the two end terminals connected to a respective terminal of the output.

17. The method of claim 16 further comprising:
sensing across each of the switches, a respective voltage polarity; and
turning each of the switches ON when the sensed voltage polarity across the respective switch comprises a first polarity and OFF when the sensed voltage polarity across the respective switch comprises a second polarity, wherein the second polarity is opposite the first polarity.

18. A method of providing fault tolerance in a power converter comprising:
supplying an alternating current from a secondary winding to an input of a full-bridge rectifier circuit having switches,
operating the switches as rectifiers to provide full-wave rectification of the alternating current at an output of the full-bridge rectifier circuit,
connecting the output of the full-bridge rectifier circuit to an output of the power converter,
monitoring selected circuit conditions;
determining from the selected circuit conditions whether a predetermined fault is present,
disabling the switches in response to a determination that the predetermined fault is present, and
providing a first one of the switches connected in series with a second one of the switches across the output of the full-bridge rectifier circuit with the first switch connected to a first terminal of the output of the full-bridge rectifier circuit and the second switch connected to a second terminal of the output of the full-bridge rectifier circuit; and
sensing an output of the second switch and preventing the first switch from turning ON if the sensing indicates that the second switch is not open; and
sensing an output of the second switch and preventing the second switch from turning ON if the sensing indicates that the first switch is not open.

19. The method of claim 18 further comprising:
sensing across each of the first and second switches, a respective voltage polarity; and
turning each of the first and second switches ON when the sensed voltage polarity across the respective switch comprises a first polarity and OFF when the sensed voltage polarity across the respective switch comprises a second polarity, wherein the second polarity is opposite the first polarity.

20. The method of claim 18 further comprising:
providing a third one of the switches and a fourth one of the switches each adapted to block current in an OFF state in at least one direction;
forming a second series circuit with the third switch connected to the fourth switch at a second junction, the second series circuit having two end terminals;
connecting the second terminal of the secondary winding to the second junction; and
connecting the second series circuit across the output of the full-bridge rectifier circuit with each of the two end terminals connected to a respective terminal of the output of the full-bridge rectifier circuit and with each of the third and fourth switches being arranged in the OFF state to block current flow through the second series circuit in a direction that would short the output of the full-bridge rectifier circuit, wherein a short across one of the third or fourth switches does not short the output of the full-bridge rectifier circuit.

21. The method of claim 20 further comprising:
preventing the third switch from turning ON if the fourth switch fails to open; and
preventing the fourth switch from turning ON if the third switch fails to open.

22. The method of claim 20 further comprising:
sensing across each of the third and fourth switches, a respective voltage polarity; and
turning each of the third and fourth switches ON when the sensed voltage polarity across the respective switch comprises a first polarity and OFF when the sensed voltage polarity across the respective switch comprises a second polarity, wherein the second polarity is opposite the first polarity.

23. The method of claim 20 further comprising:
providing a first control circuit to operate the first switch;
providing power to operate the first control circuit and first switch from across the third switch;
providing a third control circuit to operate the third switch; and
providing power to operate the third control circuit and third switch from across the first switch.

24. The method of claim 20 further comprising:
providing a second control circuit to operate the second switch;
providing power to operate the second control circuit and second switch from across the fourth switch;
providing a fourth control circuit to operate the fourth switch; and
providing power to operate the fourth control circuit and fourth switch from across the second switch.

25. The method of claim 20 further comprising:
providing a common-source dual MOSFET semiconductor device including a first MOSFET and a third MOSFET integrated on a semiconductor die;
providing a common source terminal for connecting to the first and third MOSFETs in the common-source dual MOSFET semiconductor device; and
using the first MOSFET and the third MOSFET of the common-source dual MOSFET semiconductor device for the first and third switches.

26. The method of claim 25 further comprising integrating the first and third control circuits in the common-source dual MOSFET semiconductor device.

27. The method of claim 25 further comprising:
providing a plurality of individual first and third MOSFET elements on the semiconductor die;
arranging the individual first and third MOSFET elements in an alternating pattern on the semiconductor die;
connecting the first MOSFET elements together to form the first MOSFET;
connecting the third MOSFET elements together to form the third MOSFET; and
using a common source metallization to interconnect the source terminals of the first and third MOSFET elements.

28. The method of claim 25 wherein the common-source dual MOSFET semiconductor device has exactly three terminals.

29. The method of claim 20 further comprising:
providing a first common-source dual MOSFET semiconductor device including a first MOSFET and a third MOSFET integrated on a first semiconductor die;
providing a common source terminal for connecting to the first and third MOSFETs in the first common-source dual MOSFET semiconductor device;
using the first MOSFET and the third MOSFET of the first common-source dual MOSFET semiconductor device for the first and third switches;
providing a second common-source dual MOSFET semiconductor device including a second MOSFET and a fourth MOSFET integrated on a second semiconductor die;
providing a common source terminal for connecting to the second and fourth MOSFETs in the second common-source dual MOSFET semiconductor device; and
using the second MOSFET and the fourth MOSFET of the second common-source dual MOSFET semiconductor device for the second and fourth switches.

30. The method of claim 29 further comprising:
integrating the first and third control circuits in the first common-source dual MOSFET semiconductor device; and
integrating the second and fourth control circuits in the second common-source dual MOSFET semiconductor device.

31. The method of claim 29 further comprising:
providing a plurality of individual first and third MOSFET elements on the first semiconductor die;
arranging the individual first and third MOSFET elements in an alternating pattern on the first semiconductor die;
connecting the first MOSFET elements together to form the first MOSFET;
connecting the third MOSFET elements together to form the third MOSFET;
using a common source metallization to interconnect the source terminals of the first and third MOSFET elements;
providing a plurality of individual second and fourth MOSFET elements on the second semiconductor die;
arranging the individual second and fourth MOSFET elements in an alternating pattern on the second semiconductor die;
connecting the second MOSFET elements together to form the second MOSFET;
connecting the fourth MOSFET elements together to form the fourth MOSFET; and
using a common source metallization to interconnect the source terminals of the second and fourth MOSFET elements.

32. The method of claim 29 wherein the first and second common-source dual MOSFET semiconductor devices each have exactly three terminals.

33. A fault-tolerant converter comprising:
a transformer having a primary winding and a secondary winding, the secondary winding having a first terminal and a second terminal;
a first series circuit having a first switch and a second switch each adapted to block current flow in an OFF state in at least one direction, the first switch being connected to the second switch at a first junction, the first series circuit having two end terminals, the first junction being connected to the first terminal of the secondary winding, the first series circuit being connected across an output of the converter with each of the two end terminals connected to a respective terminal of the output and with each of the first and second switches being arranged in the OFF state to block current flow through the first series circuit in a direction that would short the output, wherein a short across one of the first or second switches does not short the output; and
a switch control circuit configured to sense an output of the second switch and prevent the first switch from turning ON if the sensing indicates that the second switch is not open, and to sense an output of the first switch and prevent the second switch from turning ON if the sensing indicates that the first switch is not open.

34. The apparatus of claim 33 wherein the switch control circuit is configured to sense across each of the first and second switches, a respective voltage polarity, and to turn each of the first and second switches ON when the sensed voltage polarity across the respective switch comprises a first polarity and OFF when the sensed voltage polarity across the respective switch comprises a second polarity, wherein the second polarity is opposite the first polarity.

35. The apparatus of claim 33, comprising a second series circuit that comprises a third switch and a fourth switch each adapted to block current in an OFF state in at least one direction, the third switch being connected to the fourth switch at a second junction, the second series circuit having two end terminals, the second terminal of the secondary winding being connected to the second junction, the second series circuit being connected across the output with each of the two end terminals connected to a respective terminal of the output and with each of the third and fourth switches being arranged in the OFF state to block current flow through the second series circuit in a direction that would short the output, wherein a short across one of the third or fourth switches does not short the output.

36. The apparatus of claim 35 wherein the switch control circuit comprises a first control circuit and a third control circuit, the first control circuit operates the first switch, the third control circuit operates the third switch, the first control circuit and the first switch are powered using a voltage across the third switch, and the third control circuit and third switch are powered using a voltage across the first switch.

37. The apparatus of claim 36 wherein the switch control circuit comprises a second control circuit and a fourth control circuit, the second control circuit operates the second switch, the fourth control circuit operates the fourth switch, the second control circuit and the second switch are powered using a voltage across the fourth switch, and the fourth control circuit and fourth switch are powered using a voltage across the second switch.

38. The apparatus of claim 37, comprising:
a first common-source dual MOSFET semiconductor device that comprises a first MOSFET and a third MOSFET integrated on a first semiconductor die, the first common-source dual MOSFET semiconductor device comprising a common source terminal for connecting to the first and third MOSFETs, wherein the first MOSFET and the third MOSFET are used for the first and third switches; and
a second common-source dual MOSFET semiconductor device that comprises a second MOSFET and a fourth MOSFET integrated on a second semiconductor die, the second common-source dual MOSFET semiconductor device comprising a common source terminal for connecting to the second and fourth MOSFETs, wherein the second MOSFET and the fourth MOSFET are used for the second and fourth switches.

39. The apparatus of claim 38 wherein the first and third control circuits are integrated on the first semiconductor die, and the second and fourth control circuits are integrated on the second semiconductor die.

40. The apparatus of claim 39 wherein the first MOSFET comprises a plurality of individual first MOSFET elements on the first semiconductor die, the third MOSFET comprises a plurality of individual third MOSFET elements on the first semiconductor die, the individual first and third MOSFET elements are arranged in an alternating pattern on the first semiconductor die, a common source metallization interconnects the source terminals of the first and third MOSFET elements, the second MOSFET comprises a plurality of individual second MOSFET elements on the second semiconductor die, the individual second and fourth MOSFET elements are arranged in an alternating pattern on the second semiconductor die, and a common source metallization interconnects the source terminals of the second and fourth MOSFET elements.

41. The apparatus of claim 40 wherein the first common-source dual MOSFET semiconductor device has exactly three terminals that includes the common source terminal, a terminal connected to the drain of the first MOSFET, and a terminal connected to the drain of the third MOSFET, and
the second common-source dual MOSFET semiconductor device has exactly three terminals that include the common source terminal, a terminal connected to the drain of the second MOSFET, and a terminal connected to the drain of the fourth MOSFET.

42. The apparatus of claim 35, comprising a common-source dual MOSFET semiconductor device having a first MOSFET and a third MOSFET that are integrated on a semiconductor die, the first MOSFET is used for the first switch, the third MOSFET is used for the third switch, and the common-source dual MOSFET semiconductor device has a source terminal connected to the source of the first MOSFET and the source of the third MOSFET.

43. The apparatus of claim 42 wherein the switch control circuit comprises a first control circuit and a third control circuit, the first control circuit operates the first switch, the third control circuit operates the third switch, the first control circuit and the first switch are powered using a voltage across the third switch, the third control circuit and the third switch are powered using a voltage across the first switch, and the first and third control circuits are integrated in the semiconductor die of the common-source dual MOSFET semiconductor device.

44. The apparatus of claim 43 wherein the first MOSFET comprises a plurality of individual first MOSFET elements on the semiconductor die, the third MOSFET comprises a plurality of individual third MOSFET elements on the semiconductor die, the individual first and third MOSFET elements are arranged in an alternating pattern on the semiconductor die, and a common source metallization interconnects the source terminals of the first and third MOSFET elements.

45. The apparatus of claim 44 wherein the common-source dual MOSFET semiconductor device has exactly three terminals that includes the source terminal, a terminal connected to the drain of the first MOSFET, and a terminal connected to the drain of the third MOSFET.

46. The apparatus of claim 33, comprising a second series circuit having a first capacitor connected to a second capacitor at a second junction that is connected to the second terminal of the secondary winding, the second series circuit having two end terminals connected across the output of the converter with each of the two end terminals connected to a respective terminal of the output of the converter.

47. The apparatus of claim 46 wherein the switch control circuit is configured to sense across each of the first and second switches, a respective voltage polarity, and to turn each of the first and second switches ON when the sensed voltage polarity across the respective switch comprises a first polarity and OFF when the sensed voltage polarity across the respective switch comprises a second polarity, wherein the second polarity is opposite the first polarity.

48. A method of delivering power to an output, comprising:
providing a transformer having a secondary winding, the secondary winding having a first terminal and a second terminal;
providing a first switch, a second switch, a third switch and a fourth switch, each adapted to block current flow in an OFF state in at least one direction;
forming a first series circuit with the first switch connected to the second switch at a first junction, the first series circuit having two end terminals;
forming a second series circuit with the third switch connected to the fourth switch at a second junction, the second series circuit having two end terminals;
connecting the first terminal of the secondary winding to the first junction and the second terminal of the secondary winding to the second junction;
connecting the first series circuit across the output with each of the two end terminals connected to a respective terminal of the output, sensing outputs of the first and second switches, arranging the first switch in the OFF state if the sensing indicates that the second switch is not open, and arranging the second switch in the OFF state if the sensing indicates that the first switch is not open to block current flow through the first series circuit in a direction that would short the output, wherein a short across one of the first or second switch does not short the output;

connecting the second series circuit across the output with each of the two end terminals connected to a respective terminal of the output, sensing outputs of the third and fourth switches, arranging the third switch in the OFF state if the sensing indicates that the fourth switch is not open, and arranging the fourth switch in the OFF state if the sensing indicates that the third switch is not open to block current flow through the second series circuit in a direction that would short the output, wherein a short across one of the third or fourth switch does not short the output;

converting power via the transformer to deliver a unipolar voltage of five Volts or less to the output.

49. The method of claim 48 wherein the unipolar output is approximately 1 Volt.

* * * * *

UNITED STATES PATENT AND TRADEMARK OFFICE
CERTIFICATE OF CORRECTION

PATENT NO. : 9,112,422 B1  
APPLICATION NO. : 13/044063  
DATED : August 18, 2015  
INVENTOR(S) : Patrizio Vinciarelli It is certified that error appears in the above-identified patent and that said Letters Patent is hereby corrected as shown below:

In the Specification

Col. 2, line 33, delete "inc." and insert -- Inc. --, therefor.

Col. 17, line 22, delete "1110N" and insert -- 111 ON --, therefor.

Col. 27, line 1, delete "inc." and insert -- Inc. --, therefor.

Signed and Sealed this  
Eighth Day of March, 2016

Michelle K. Lee  
*Director of the United States Patent and Trademark Office*